US012772511B2

(12) United States Patent
Lin et al.

(10) Patent No.: US 12,772,511 B2
(45) Date of Patent: Oct. 20, 2026

(54) SEMICONDUCTOR STRUCTURE AND METHOD FOR FORMING THE SAME

(71) Applicant: Taiwan Semiconductor Manufacturing Company, Ltd., Hsinchu (TW)

(72) Inventors: Ta-Chun Lin, Hsinchu (TW); Kuo-Hua Pan, Hsinchu City (TW); Chih-Hao Chang, Hsin-chu (TW); Jhon-Jhy Liaw, Zhudong Township, Hsinchu County (TW)

(73) Assignee: Taiwan Semiconductor Manufacturing Company, Ltd., Hsinchu (TW)

( * ) Notice: Subject to any disclaimer, the term of this patent is extended or adjusted under 35 U.S.C. 154(b) by 1019 days.

(21) Appl. No.: 17/887,306

(22) Filed: Aug. 12, 2022

(65) Prior Publication Data

US 2024/0055481 A1 Feb. 15, 2024

(51) Int. Cl.

*H10D 62/10* (2025.01)
*H10D 30/01* (2025.01)
*H10D 30/43* (2025.01)
*H10D 30/67* (2025.01)
*H10D 84/01* (2026.01)
*H10D 84/03* (2025.01)

(52) U.S. Cl.

CPC ......... *H10D 62/121* (2025.01); *H10D 30/014* (2025.01); *H10D 30/43* (2025.01);

(Continued)

(58) Field of Classification Search

CPC ......... H01L 21/76897; H01L 21/76224; H01L 21/764; H01L 21/28097; H01L 21/28518; H10D 62/121; H10D 30/6735; H10D 84/0151; H10D 84/0135; H10D 84/0128; H10D 30/797; H10D 84/0158; H10D 62/118; H10D 84/013; H10D 62/115; H10D 84/834; H10D 84/0167; H10D 84/0188; H10D 84/017; H10D 30/024; H10D 30/62; H10D 30/6211; H10D 30/501; H10D 84/853; H10D 84/0193; H10D 84/0147; H10D 30/019; H10D 30/0198; H10D 30/0212; H10D 30/0225; H10D 62/021; H10D 30/014; H10D 30/43;

(Continued)

(56) References Cited

U.S. PATENT DOCUMENTS 9,209,247 B2 12/2015 Colinge et al.
9,236,267 B2 1/2016 De et al.

(Continued)

*Primary Examiner* — Mark W Tornow
*Assistant Examiner* — Priya M Rampersaud
(74) *Attorney, Agent, or Firm* — Cooper Legal Group, LLC

(57) ABSTRACT

Semiconductor structures and methods for forming the same are provided. The semiconductor structure includes a gate structure formed over a substrate, and a first source/drain (S/D) structure formed adjacent to the gate structure. The semiconductor structure includes an S/D contact structure formed over the first S/D structure, and a dielectric wall formed below the gate structure and the S/D contact structure. The dielectric wall has a first portion directly below the S/D contact structure and a second portion directly below the gate structure, the first portion has a first height along a vertical direction, the second portion has a second height along the vertical direction, and the first height is smaller than the second height.

20 Claims, 28 Drawing Sheets

(52) U.S. Cl.
CPC ..... *H10D 30/6729* (2025.01); *H10D 30/6757* (2025.01); *H10D 84/0128* (2025.01); *H10D 84/013* (2025.01); *H10D 84/038* (2025.01)

(58) Field of Classification Search
CPC ........... H10D 30/6729; H10D 30/6757; H10D 62/151; H10D 84/0149; H10D 84/038; H10D 84/83; H01R 4/185; H01R 4/70; H01R 4/62; H01R 4/188
See application file for complete search history.

(56) References Cited

U.S. PATENT DOCUMENTS

| | | | | |
|---|---|---|---|---|
| 9,412,817 | B2 | 8/2016 | Yang et al. | |
| 9,412,828 | B2 | 8/2016 | Ching et al. | |
| 9,472,618 | B2 | 10/2016 | Oxland | |
| 9,502,265 | B1 | 11/2016 | Jiang et al. | |
| 9,520,482 | B1 | 12/2016 | Chang et al. | |
| 9,536,738 | B2 | 1/2017 | Huang et al. | |
| 9,576,814 | B2 | 2/2017 | Wu et al. | |
| 9,608,116 | B2 | 3/2017 | Ching et al. | |
| 2019/0043857 | A1* | 2/2019 | Wu | H10D 84/834 |
| 2019/0067445 | A1* | 2/2019 | Ching | H10D 62/116 |
| 2019/0165127 | A1* | 5/2019 | Ching | H10W 10/0143 |
| 2020/0006557 | A1* | 1/2020 | Ko | H10D 30/792 |
| 2021/0057525 | A1* | 2/2021 | Chiang | H10D 62/121 |
| 2021/0305361 | A1* | 9/2021 | Pranatharthi Haran | H10D 84/038 |
| 2021/0343713 | A1* | 11/2021 | Ju | H10D 84/83 |
| 2023/0260998 | A1* | 8/2023 | Ju | H10D 84/0188 257/351 |

* cited by examiner

SEMICONDUCTOR STRUCTURE AND METHOD FOR FORMING THE SAME

BACKGROUND

The electronics industry is experiencing ever-increasing demand for smaller and faster electronic devices that are able to perform a greater number of increasingly complex and sophisticated functions. Accordingly, there is a continuing trend in the semiconductor industry to manufacture low-cost, high-performance, and low-power integrated circuits (ICs). So far, these goals have been achieved in large part by scaling down semiconductor IC dimensions (e.g., minimum feature size) and thereby improving production efficiency and lowering associated costs. However, such miniaturization has introduced greater complexity into the semiconductor manufacturing process. Thus, the realization of continued advances in semiconductor ICs and devices calls for similar advances in semiconductor manufacturing processes and technology.

Recently, multi-gate devices have been introduced in an effort to improve gate control by increasing gate-channel coupling, reduce OFF-state current, and reduce short-channel effects (SCEs). However, integration of fabrication of the multi-gate devices can be challenging.

BRIEF DESCRIPTION OF THE DRAWINGS

Aspects of the present disclosure are best understood from the following detailed description when read with the accompanying Figures. It should be noted that, in accordance with the standard practice in the industry, various features are not drawn to scale. In fact, the dimensions of the various features may be arbitrarily increased or reduced for clarity of discussion.

FIGS. 2A-2 to 2P-2 show cross-sectional representations of various stages of manufacturing the semiconductor structure shown along line B-B' in FIG. 1E, in accordance with some embodiments.

FIG. 2P'-2 shows a cross-sectional view of a semiconductor structure 100*b*, in accordance with some embodiments.

FIG. 2P-3 shows the cross-sectional representation shown along line III-III' in FIG. 3, in accordance with some embodiments.

FIG. 2P-4 shows the cross-sectional representation shown along line IV-IV' in FIG. 3, in accordance with some embodiments.

FIG. 3 shows a perspective view of the semiconductor structure 100*a* after FIGS. 2O-1 and 2O-2, in accordance with some embodiments.

FIG. 4 shows a cross-sectional view of a semiconductor structure, in accordance with some embodiments.

DETAILED DESCRIPTION

Figure 1A:
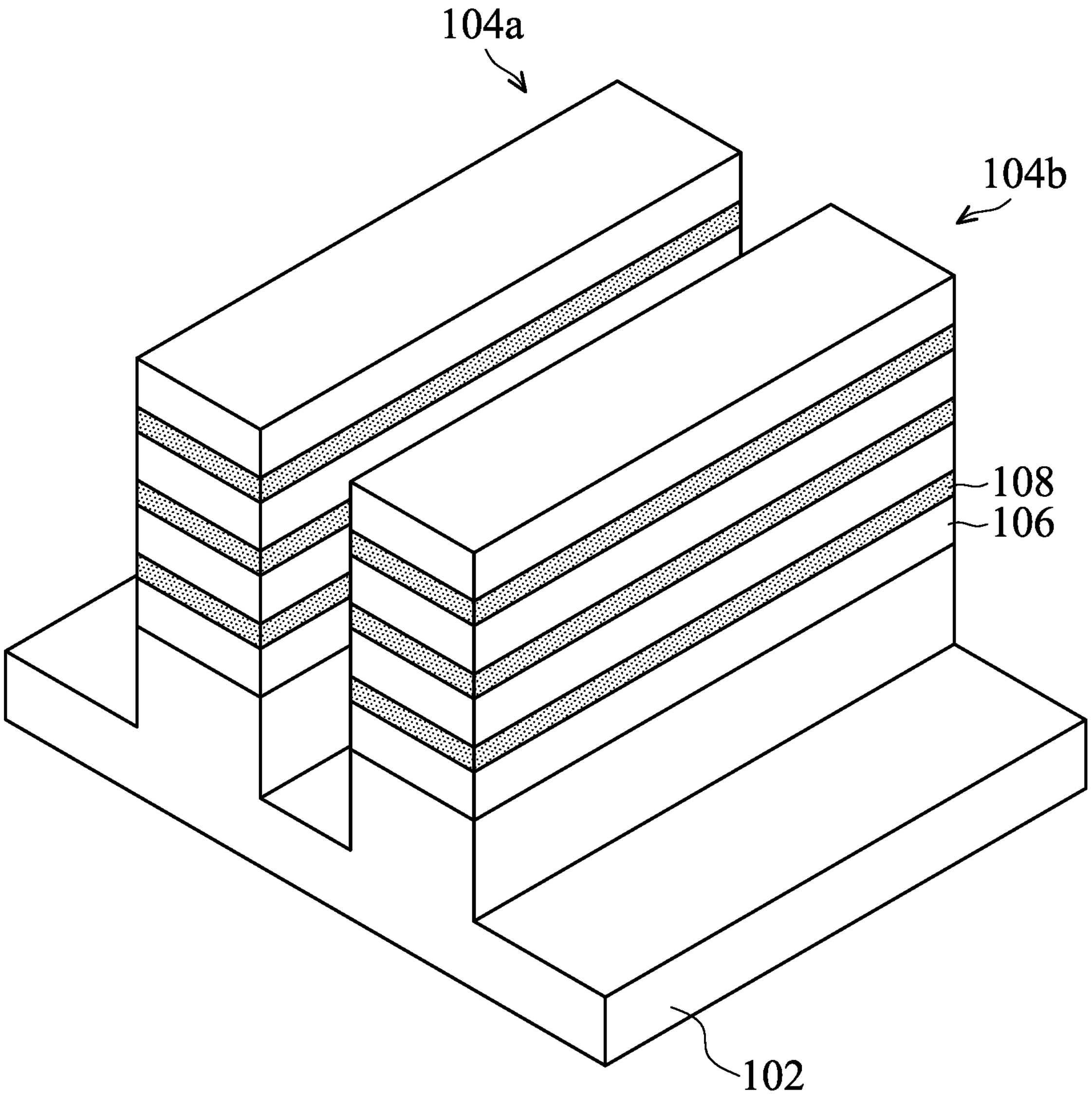
FIGS. 1A to 1E show perspective views of intermediate stages of manufacturing a semiconductor structure, in accordance with some embodiments.

The following disclosure provides many different embodiments, or examples, for implementing different features of the subject matter provided. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Some variations of the embodiments are described. Throughout the various views and illustrative embodiments, like reference numerals are used to designate like elements. It should be understood that additional operations can be provided before, during, and after the method, and some of the operations described can be replaced or eliminated for other embodiments of the method.

The gate all around (GAA) transistor structures described below may be patterned by any suitable method. For example, the structures may be patterned using one or more photolithography processes, including double-patterning or multi-patterning processes. Generally, double-patterning or multi-patterning processes combine photolithography and self-aligned processes, allowing patterns to be created that have, for example, smaller pitches than what is otherwise obtainable using a single, direct photolithography process. For example, in one embodiment, a sacrificial layer is formed over a substrate and patterned using a photolithography process. Spacers are formed alongside the patterned sacrificial layer using a self-aligned process. The sacrificial layer is then removed, and the remaining spacers may then be used to pattern the GAA structure.

The fins described below may be patterned by any suitable method. For example, the fins may be patterned using one or more photolithography processes, including double-patterning or multi-patterning processes. Generally, double-patterning or multi-patterning processes combine photolithography and self-aligned processes, allowing patterns to be created that have, for example, pitches smaller than what is otherwise obtainable using a single, direct photolithography process. For example, in one embodiment, a sacrificial layer is formed over a substrate and patterned using a photolithography process. Spacers are formed alongside the patterned sacrificial layer using a self-aligned process. The sacrificial layer is then removed, and the remaining spacers may then be used to pattern the fins.

Embodiments of semiconductor structures and methods for forming the same are provided. The semiconductor structures may include a gate structure formed over a substrate and a source/drain (S/D) structure formed adjacent to the gate structure. An S/D contact structure is formed over the S/D structure. A dielectric wall is formed below the gate structure and the S/D contact structure. The dielectric wall has a first portion directly below the S/D contact structure and a second portion directly below the gate structure. When forming the dielectric wall, a void may formed in the dielectric wall. The void may case short issue between the gate structure and the S/D contact structure. In order to reduce the short issue, the top portion of the dielectric wall is reduced or shortened. Since the dielectric wall is shortened, the S/D contact structure is not in direct contact with the dielectric wall and the void is removed. Accordingly, the risk of unwanted short issue between the gate structure and the S/D contact structure through the void is reduced. In addition, the S/D contact structure has more contact area with the S/D structure. Therefore, the reliability and yield of the semiconductor structure is improved by reducing the height of the dielectric wall directly below the S/D contact structure. Source/drain (S/D) region(s) S/D structures may refer to a source or a drain, individually or collectively dependent upon the context.

FIGS. 1A to 1E show perspective views of intermediate stages of manufacturing a semiconductor structure 100*a* in accordance with some embodiments. As shown in FIG. 1A, first semiconductor material layers 106 and second semiconductor material layers 108 are formed over a substrate 102.

The substrate 102 may be a semiconductor wafer such as a silicon wafer. Alternatively or additionally, the substrate 102 may include elementary semiconductor materials, compound semiconductor materials, and/or alloy semiconductor materials. Elementary semiconductor materials may include, but are not limited to, crystal silicon, polycrystalline silicon, amorphous silicon, germanium, and/or diamond. Compound semiconductor materials may include, but are not limited to, silicon carbide, gallium arsenic, gallium phosphide, indium phosphide, indium arsenide, and/or indium antimonide. Alloy semiconductor materials may include, but are not limited to, SiGe, GaAsP, AlInAs, AlGaAs, GaInAs, GaInP, and/or GaInAsP.

In some embodiments, the first semiconductor material layers 106 and the second semiconductor material layers 108 are alternately stacked over the substrate 102. In some embodiments, the first semiconductor layers 106 and the second semiconductor layers 108 independently include silicon (Si), germanium (Ge), silicon germanium ($Si_{1-x}Ge_x$, $0.1<x<0.7$, the value x is the atomic percentage of germanium (Ge) in the silicon germanium), indium arsenide (InAs), indium gallium arsenide (InGaAs), indium antimonide (InSb), or another applicable material.

The first semiconductor layers 106 and the second semiconductor layers 108 are made of different materials having different lattice constant. In some embodiments, the first semiconductor layer 106 is made of silicon (Si), and the second semiconductor layer 108 is made of silicon germanium ($Si_{1-x}Ge_x$, $0.1<x<0.7$). In some other embodiments, the first semiconductor layer 106 is made of silicon germanium ($Si_{1-x}Ge_x$, $0.1<x<0.7$), and the second semiconductor layer 108 is made of silicon (Si).

It should be noted that although four first semiconductor material layers 106 and three second semiconductor material layers 108 are formed, the semiconductor structure may include more or fewer first semiconductor material layers 106 and second semiconductor material layers 108. For example, the semiconductor structure may include two to five of the first semiconductor material layers 106 and the second semiconductor material layers.

The first semiconductor material layers 106 and the second semiconductor material layers 108 may be formed by using low-pressure chemical vapor deposition (LPCVD), epitaxial growth process, another suitable method, or a combination thereof. In some embodiments, the epitaxial growth process includes molecular beam epitaxy (MBE), metal organic chemical vapor deposition (MOCVD), or vapor phase epitaxy (VPE).

As shown in FIG. 1A, after the first semiconductor material layers 106 and the second semiconductor material layers 108 are formed as a semiconductor material stack over the substrate 102, the semiconductor material stack is patterned to form a first stack structure 104*a* and a second stack structure 104*b*, in accordance with some embodiments.

In some embodiments, the patterning process includes forming a mask structure (not shown) over the semiconductor material stack, and etching the semiconductor material stack and the underlying substrate 102 through the mask structure. In some embodiments, the mask structure is a multilayer structure including a pad oxide layer and a nitride layer formed over the pad oxide layer. The pad oxide layer may be made of silicon oxide, which is formed by thermal oxidation or chemical vapor deposition (CVD), and the nitride layer may be made of silicon nitride, which is formed by chemical vapor deposition (CVD), such as low-temperature chemical vapor deposition (LPCVD) or plasma-enhanced CVD (PECVD).

Figure 1B:
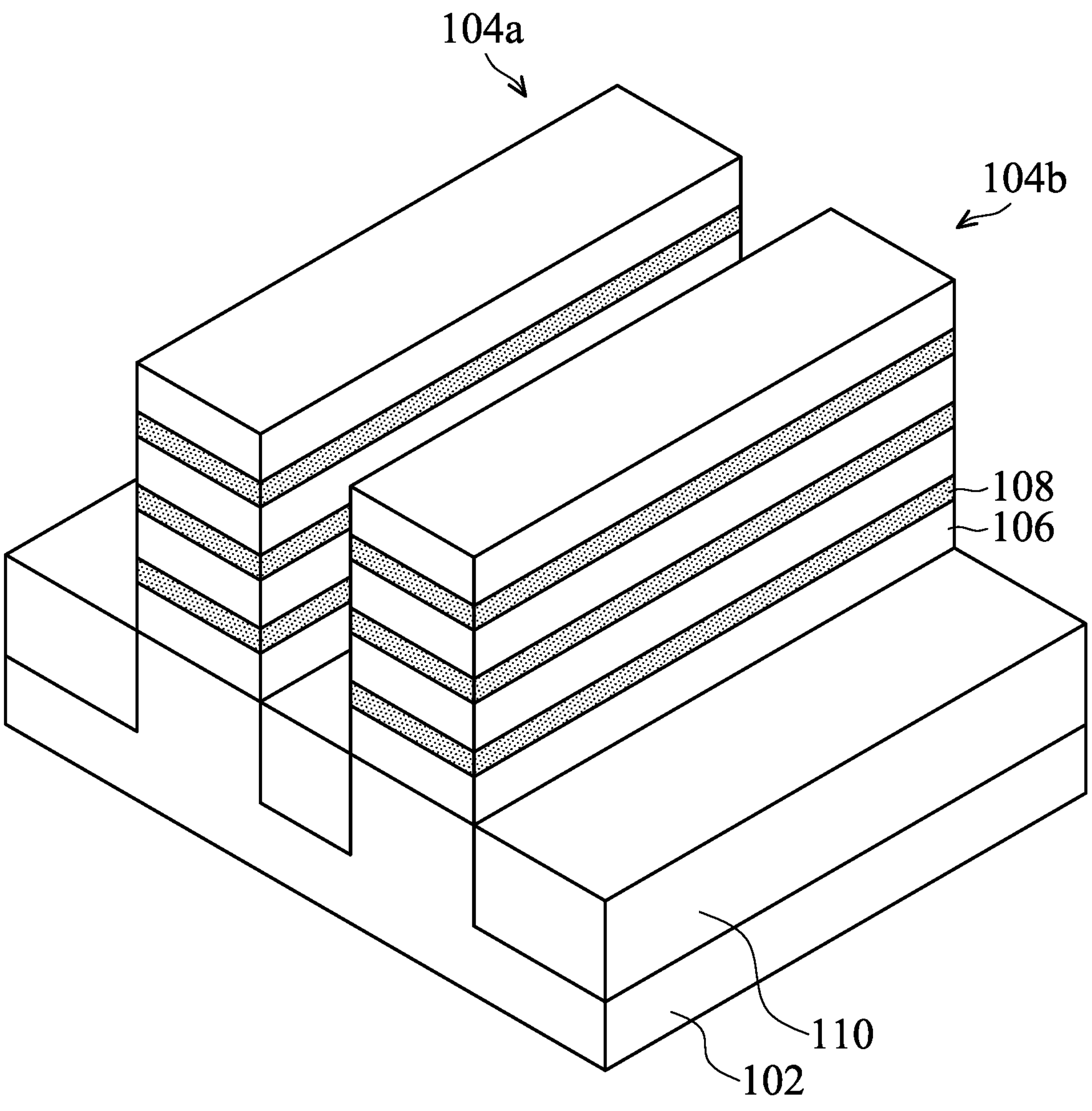

As shown in FIG. 1B, after the first stack structure 104*a* and the second stack structure 104*b* are formed, an isolation structure 110 is formed around the first stack structure 104*a* and the second stack structure 104*b*, in accordance with some embodiments. The isolation structure 110 is configured to electrically isolate active regions (e.g. the first stack structure 104*a* or the second stack structure 104*b*) of the semiconductor structure 100*a* and is also referred to as shallow trench isolation (STI) feature in accordance with some embodiments.

The isolation structure 110 may be formed by depositing an insulating layer over the substrate 102 and recessing the insulating layer so that the first stack structure 104*a* and the second stack structure 104*b* are protruded from the isolation structure 110. In some embodiments, the isolation structure 110 is made of silicon oxide, silicon nitride, silicon oxynitride (SiON), another suitable insulating material, or a combination thereof. In some embodiments, a dielectric liner (not shown) is formed before the isolation structure 116 is formed, and the dielectric liner is made of silicon nitride and the isolation structure formed over the dielectric liner is made of silicon oxide.

Figure 1C:
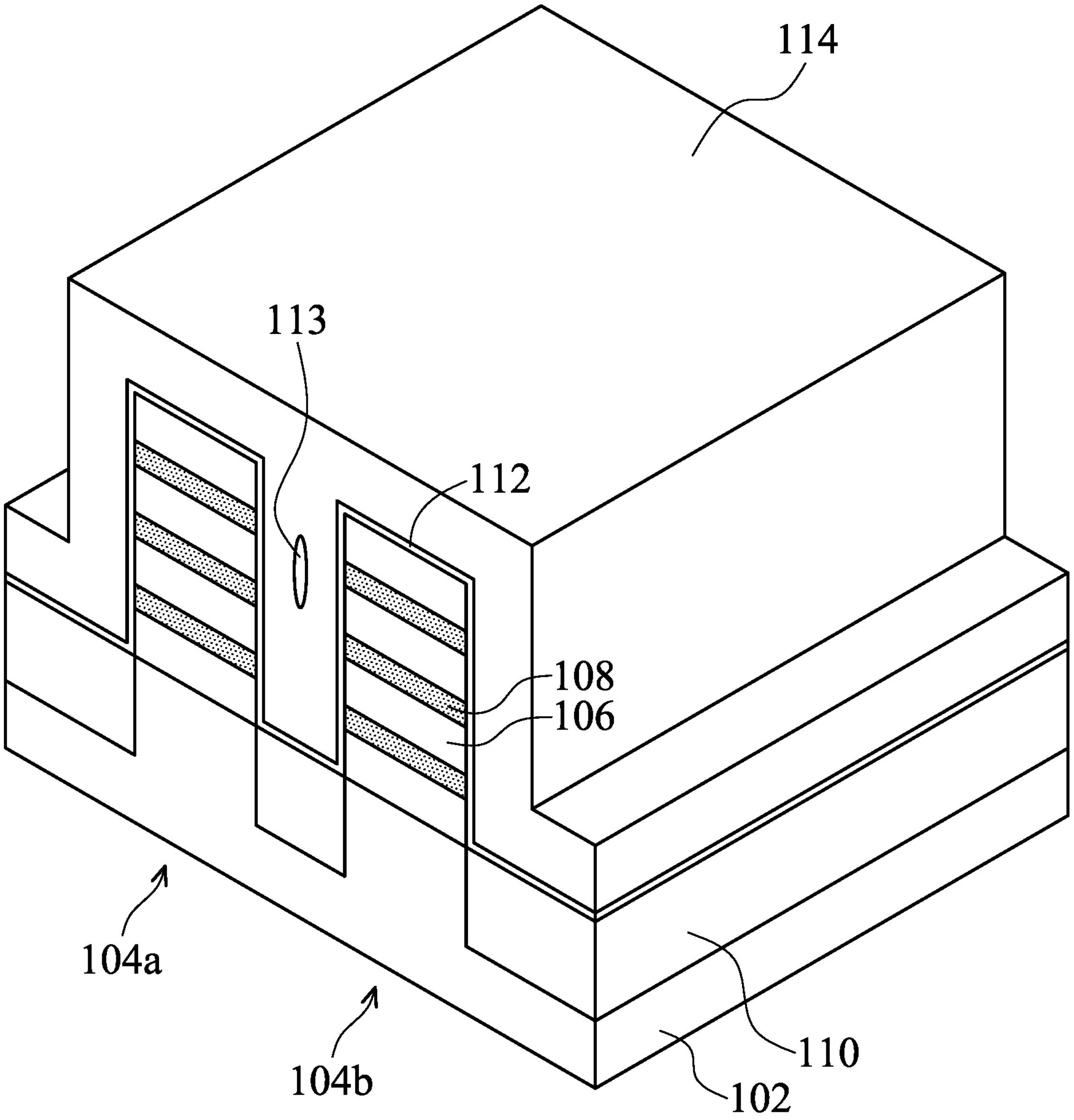

Afterwards, as shown in FIG. 1C, a liner dielectric layer 112 is formed over the first stack structure 104*a* and the second stack structure 104*b*, and a core dielectric layer 114 is formed over the liner dielectric layer 112, in accordance with some embodiments. The liner dielectric layer 112 is an adhesion layer to improve the adhesion between the core dielectric layer 114 and the first stack structure 104*a* and the second stack structure 104*b*. During formation of the core dielectric layer 114, a void 113 is formed in the core dielectric layer 114.

In some embodiments, the liner dielectric layer 112 is made of oxide, such as silicon oxide. In some embodiments, the liner dielectric layer 112 is formed by chemical vapor deposition (CVD), atomic vapor deposition (ALD), physical vapor deposition (PVD), another suitable method, or a combination thereof. In some embodiments, the core dielectric layer 114 is made of SiN, SiCN, SiOC, SiOCN or applicable material. In some embodiments, the core dielectric layer 114 is formed by chemical vapor deposition (CVD), atomic vapor deposition (ALD), physical vapor deposition (PVD), another suitable method, or a combination thereof.

Figure 1D:
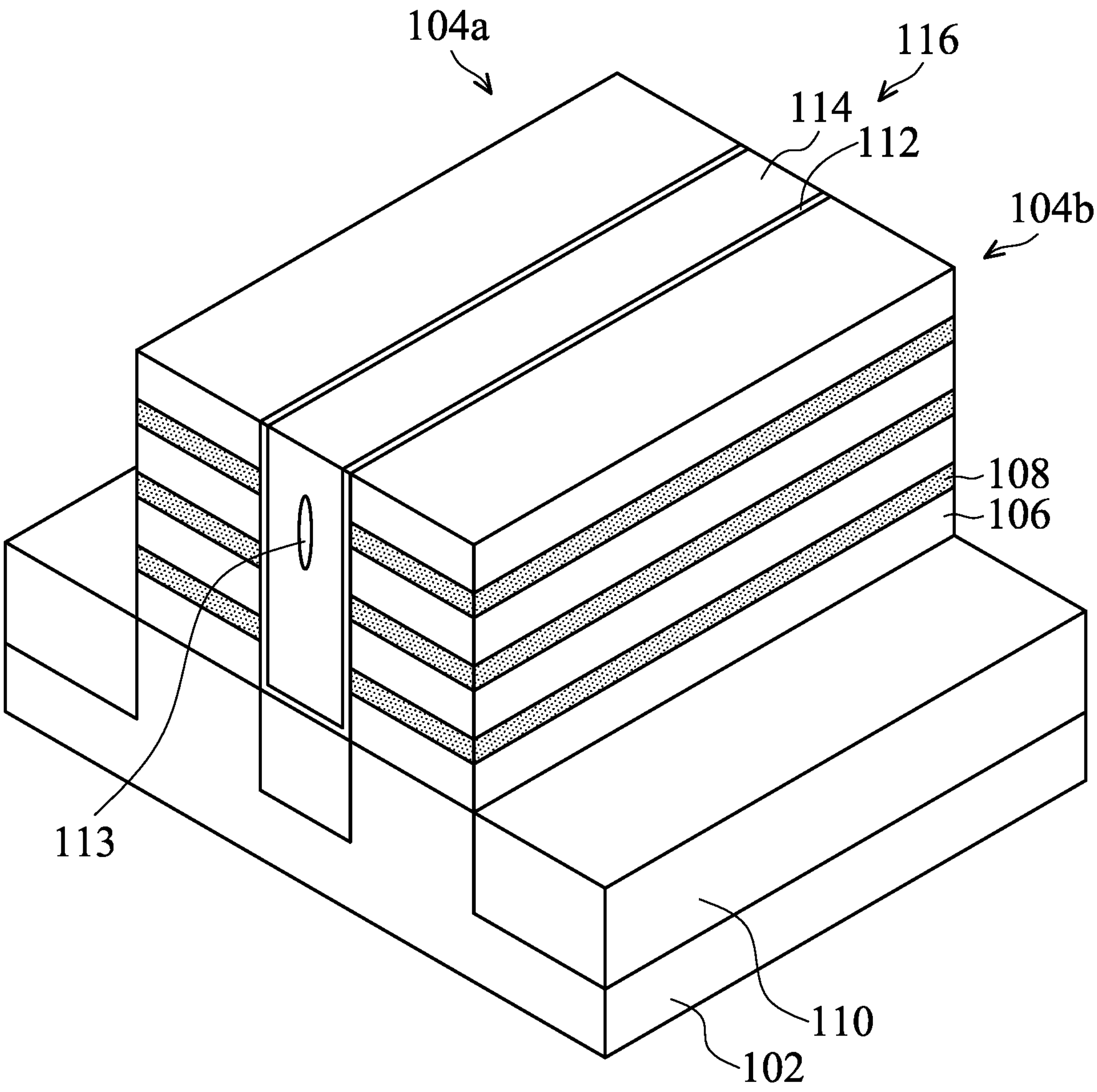

Next, as shown in FIG. 1D, a portion of the liner dielectric layer 112 and a portion of the core dielectric layer 114 are removed to form a dielectric wall 116 between two adjacent first stack structure 104*a* and the second stack structure 104*b*, in accordance with some embodiments. More specifically, the dielectric wall 116 is in direct contact with the first semiconductor layers 106 and the second semiconductor layers 108. The dielectric wall 116 is in direct contact with the isolation structure 110. The top surface of the core dielectric layer 114 is substantially level with the top surface of the topmost second semiconductor layer 108.

Figure 1E:
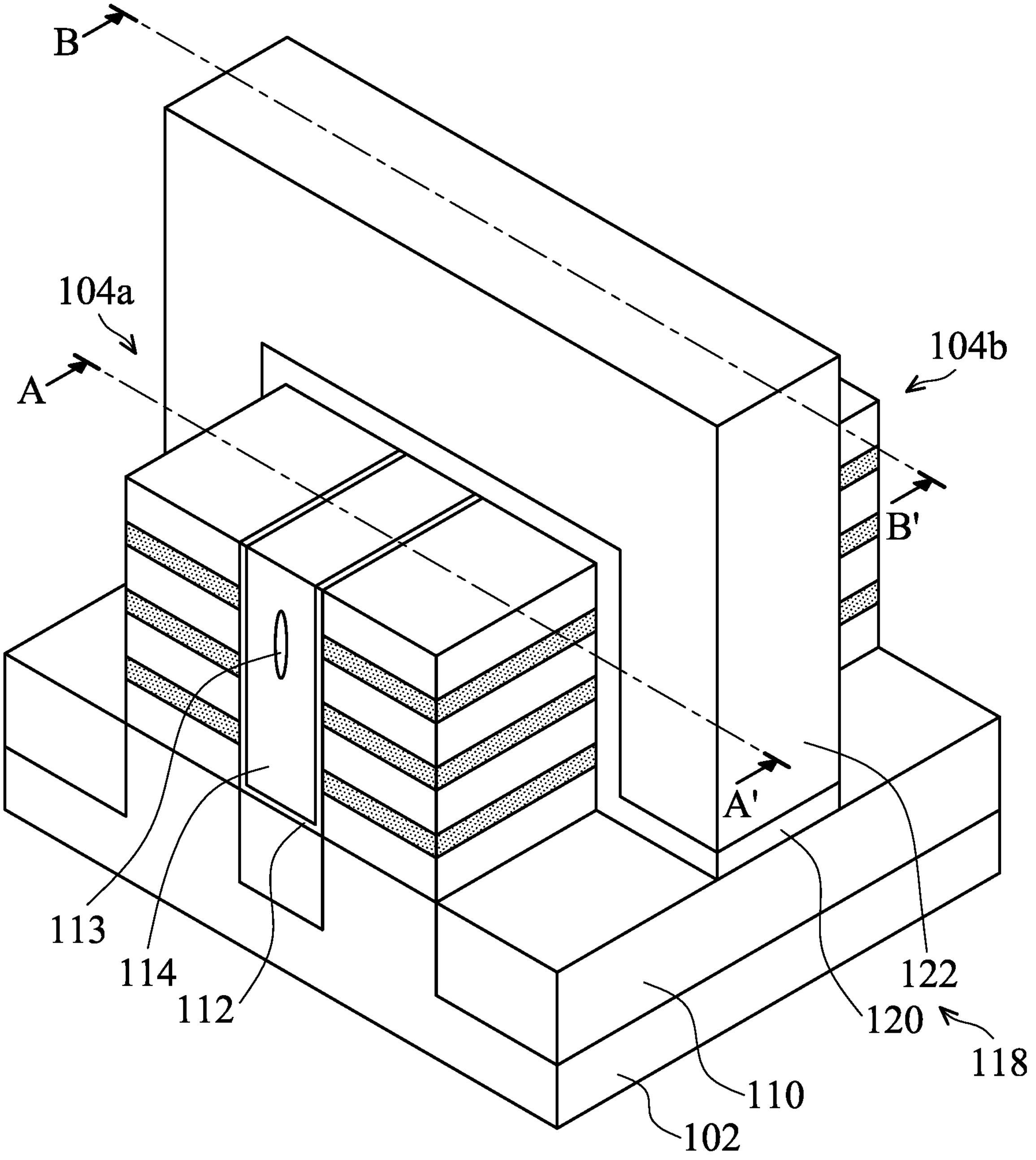

Afterwards, as shown in FIG. 1E, after the dielectric wall 116 is formed, a dummy gate structure 118 is formed across the first stack structure 104*a* and the second stack structure 104*b* and extends over the isolation structure 110, in accordance with some embodiments.

The dummy gate structures 118 may be used to define the source/drain (S/D) regions and the channel regions of the resulting semiconductor structure 100*a*. In some embodiments, the dummy gate structures 118 include a dummy gate dielectric layer 120 and a dummy gate electrode layer 122.

In some embodiments, the dummy gate dielectric layer 120 are made of one or more dielectric materials, such as silicon oxide, silicon nitride, silicon oxynitride (SiON), $HfO_2$, HfZrO, HfSiO, HfSiO, HfAlO, or a combination thereof. In some embodiments, the dummy gate dielectric layer 120 is formed using thermal oxidation, chemical vapor deposition (CVD), atomic vapor deposition (ALD), physical vapor deposition (PVD), another suitable method, or a combination thereof. In some embodiments, the dummy gate electrode layer 122 includes polycrystalline-silicon (poly-Si), poly-crystalline silicon-germanium (poly-SiGe), metallic nitrides, metallic silicides, metals, or a combination thereof. In some embodiments, the dummy gate electrode layer 122 is formed using chemical vapor deposition (CVD), physical vapor deposition (PVD), or a combination thereof.

Figures 1, 2A:
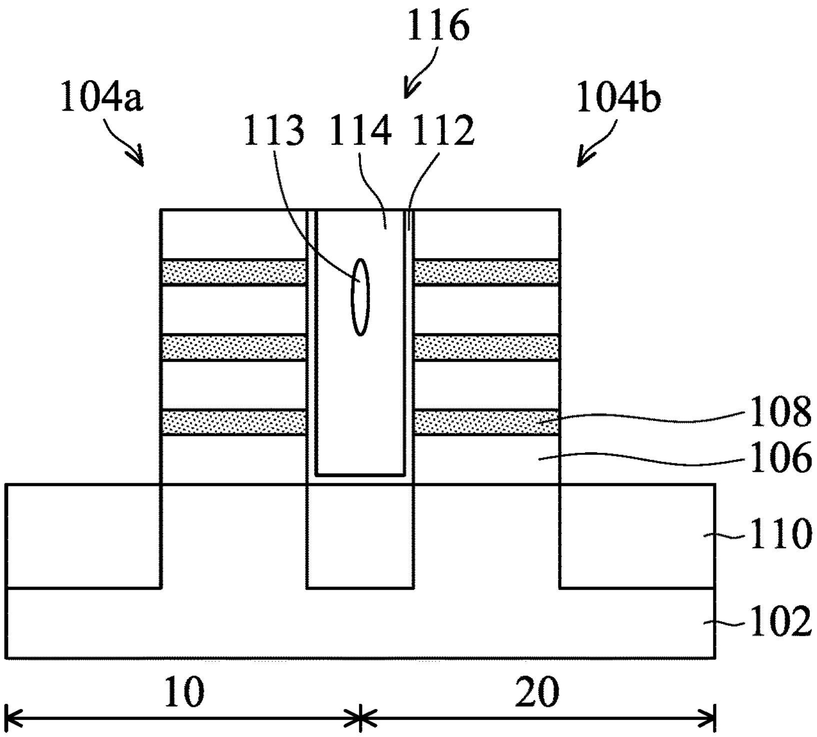
FIGS. 2A-1 to 2P-1 show cross-sectional representations of various stages of manufacturing the semiconductor structure shown along line A-A' in FIG. 1E, in accordance with some embodiments.
Figures 2, 2A:
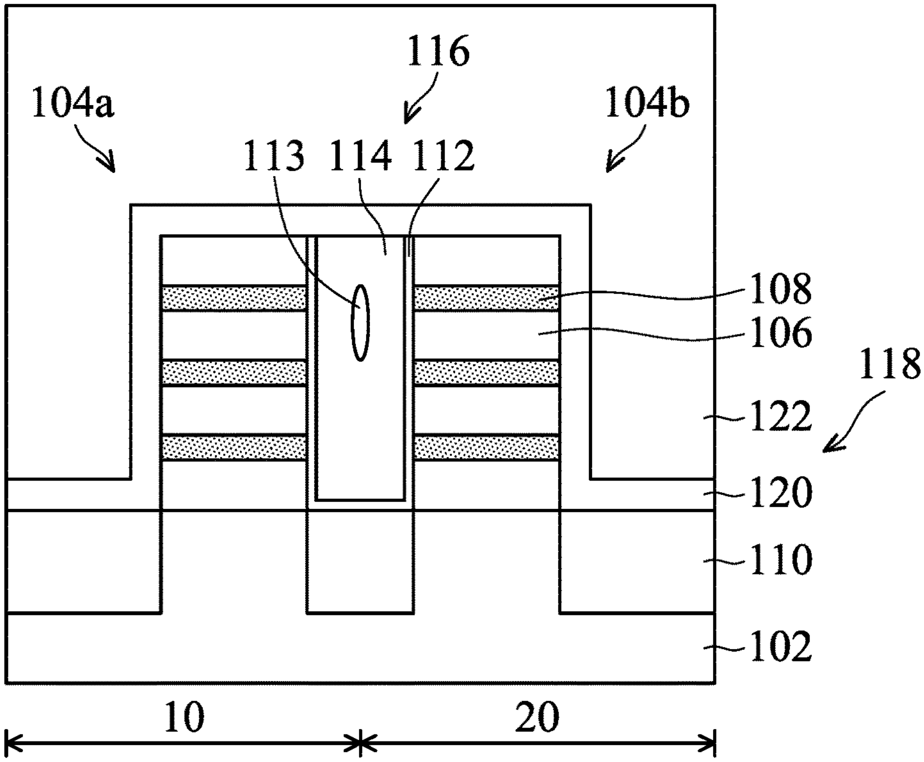
Figures 1, 2B:
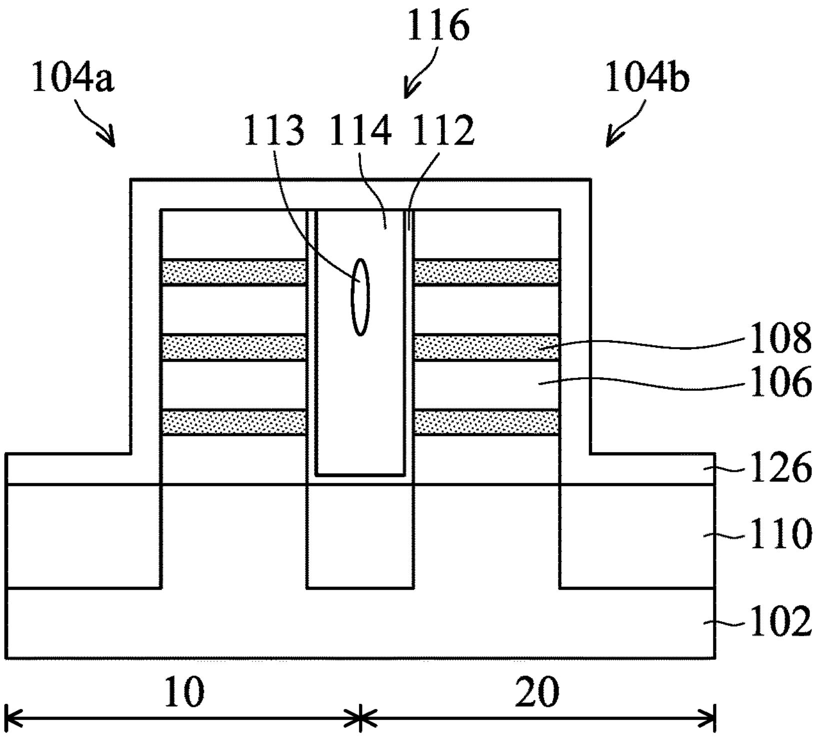
Figures 2, 2B:
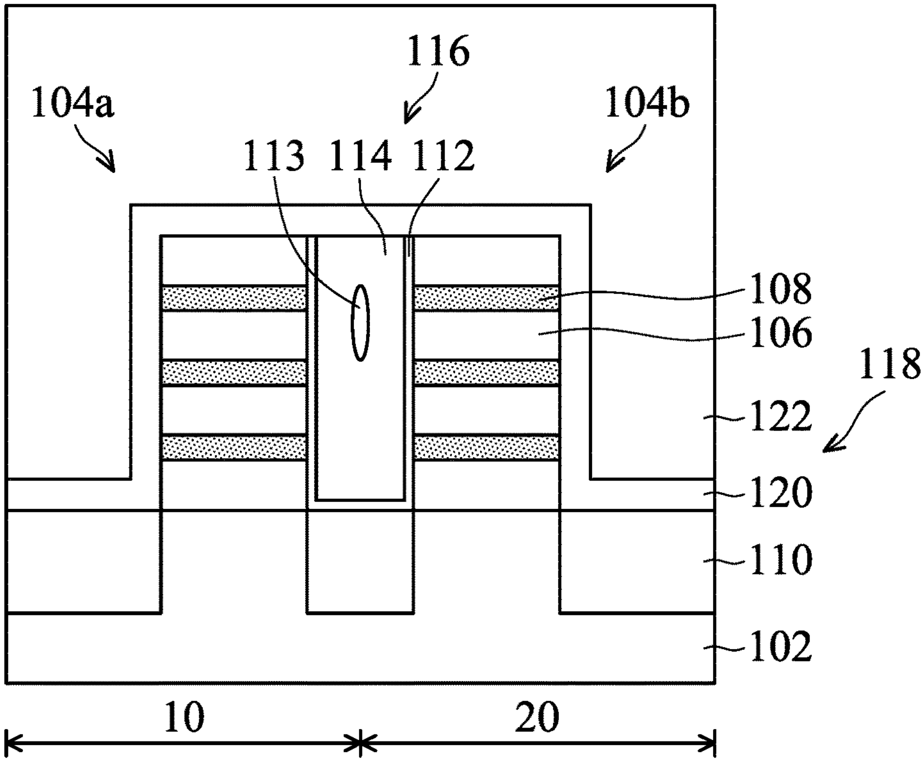
Figures 1, 2C:
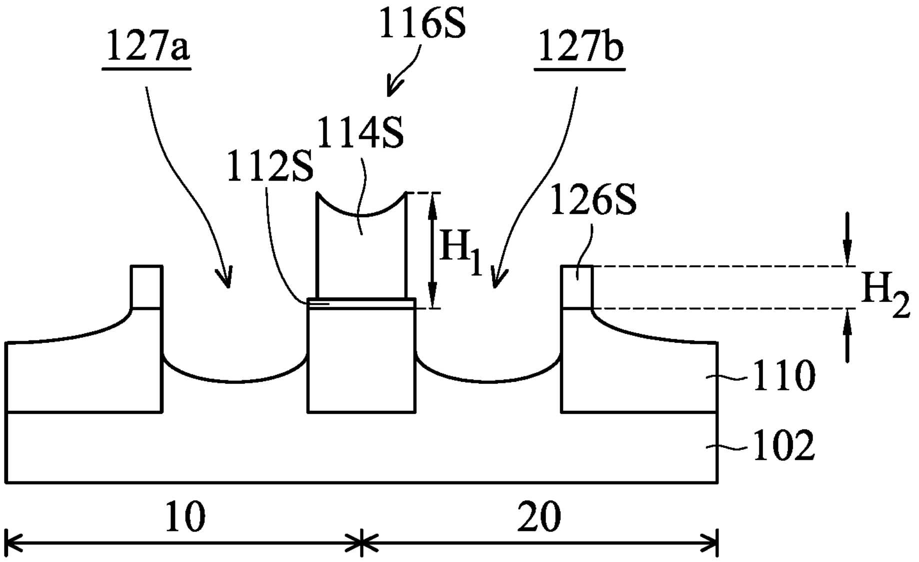
Figures 2, 2C:
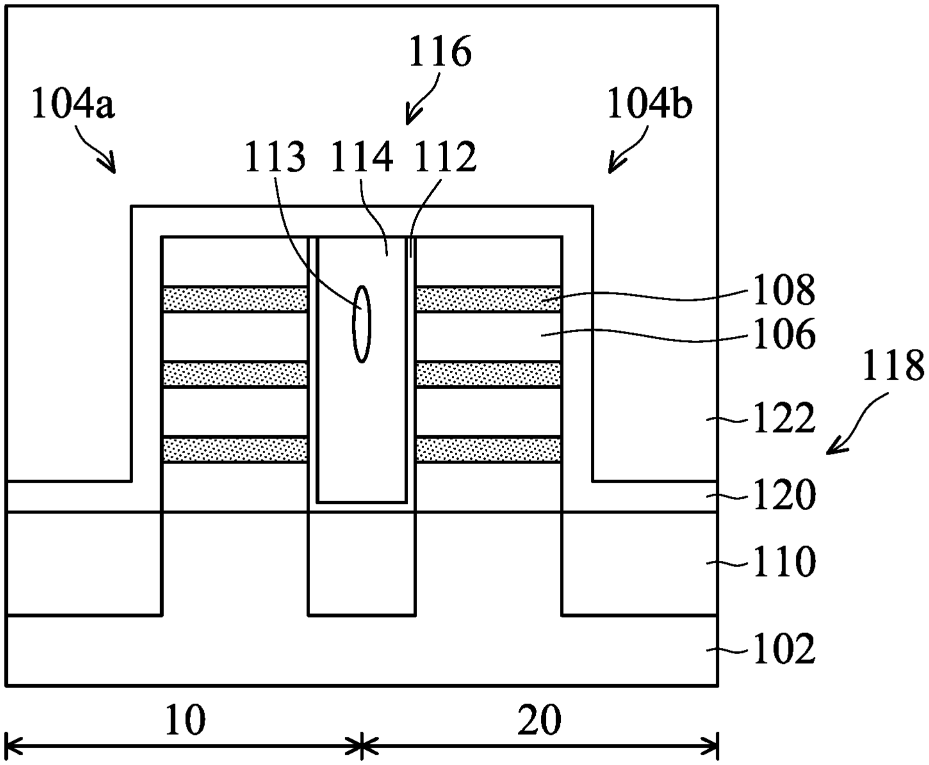
Figures 1, 2D:
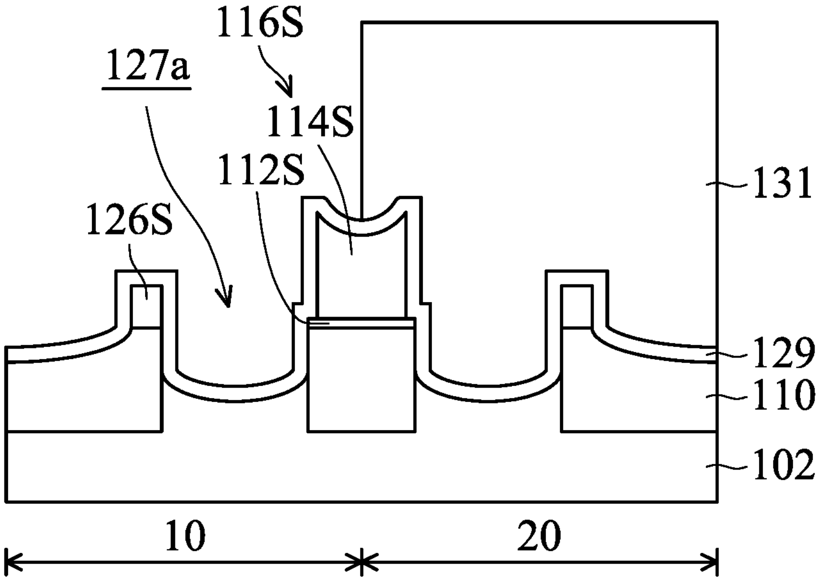
Figures 2, 2D:
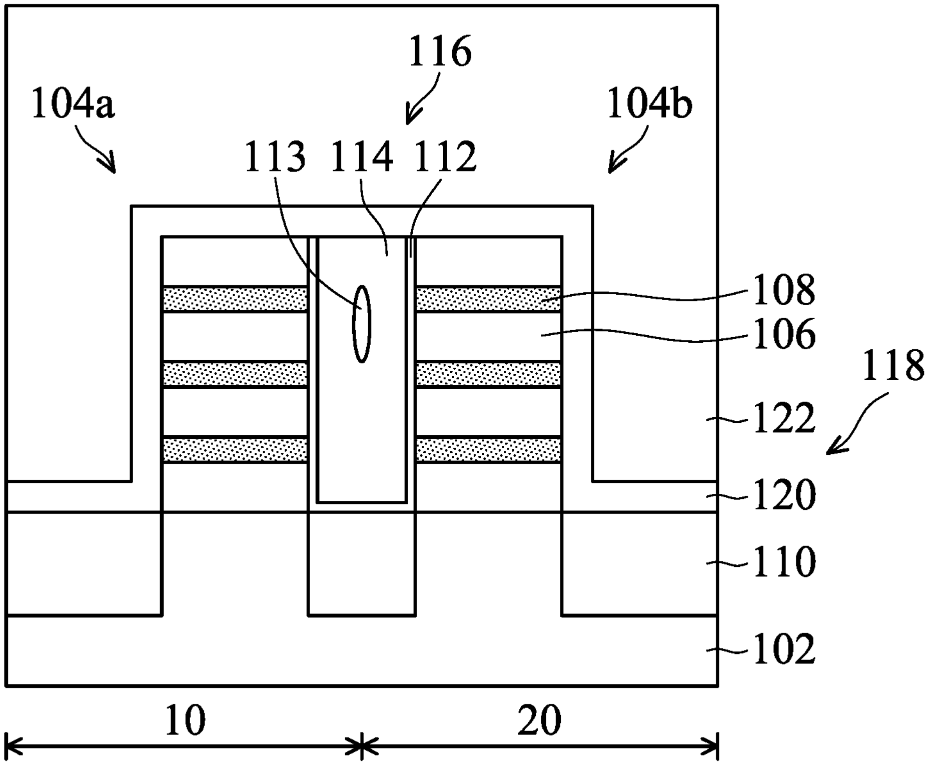
Figures 1, 2E:
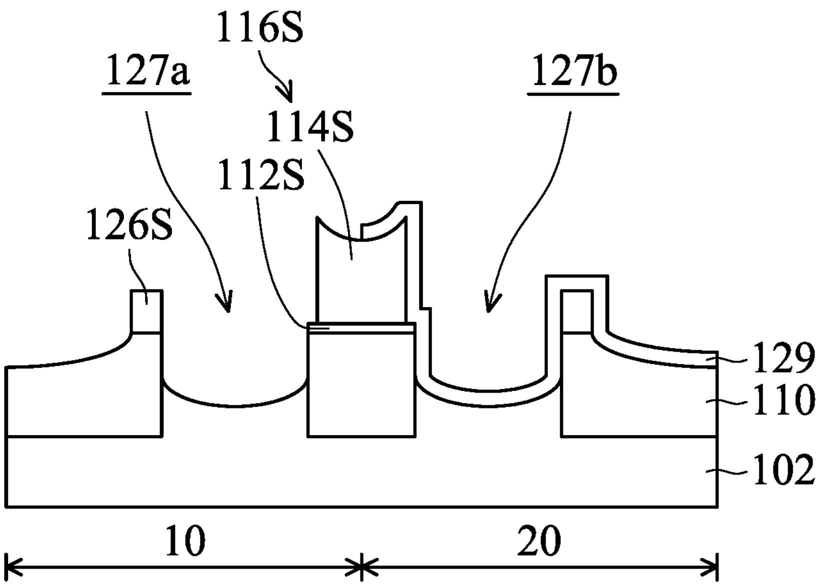
Figures 2, 2E:
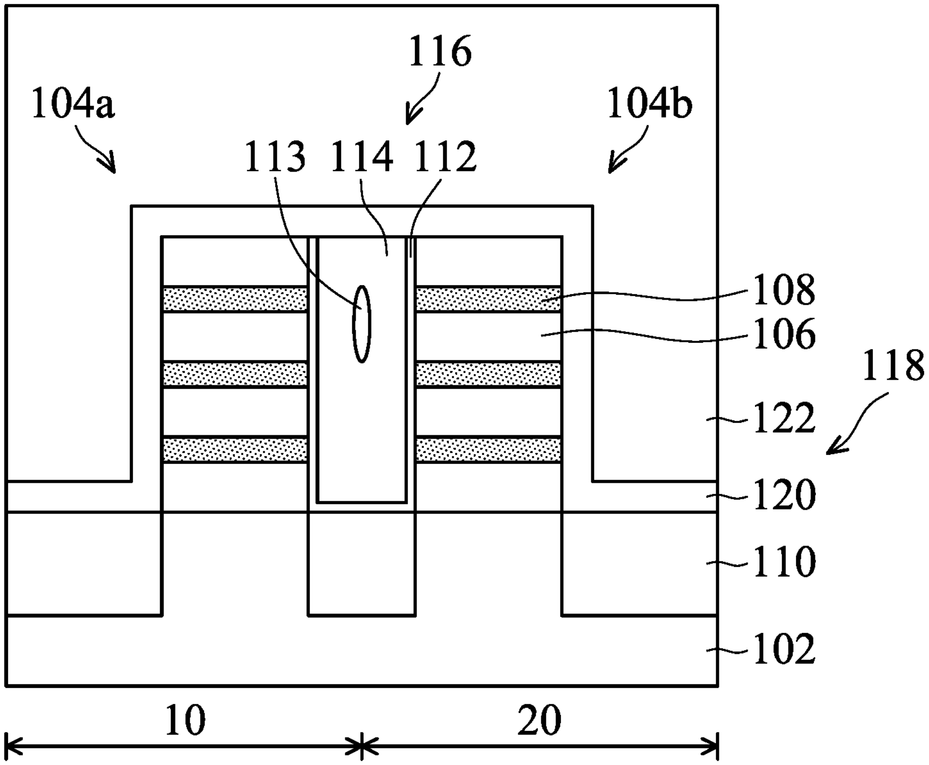
Figures 1, 2F:
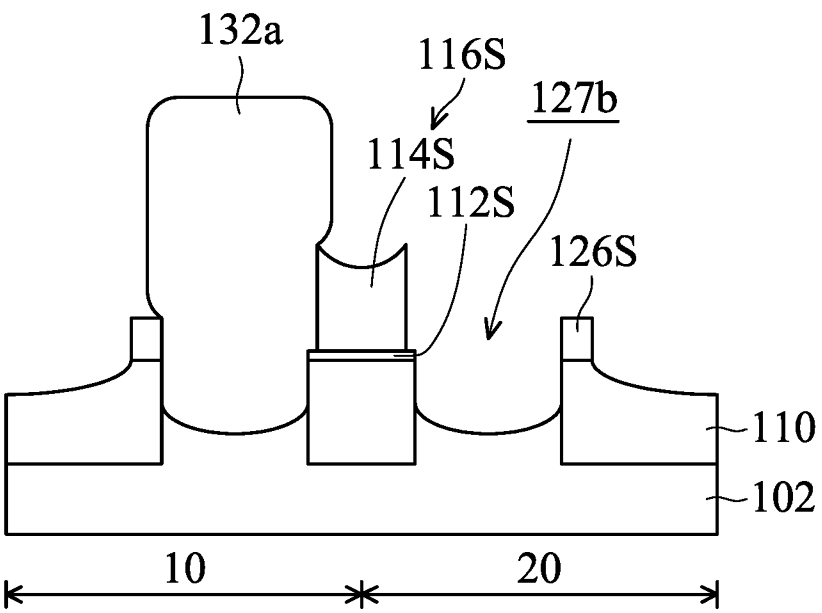
Figures 2, 2F:
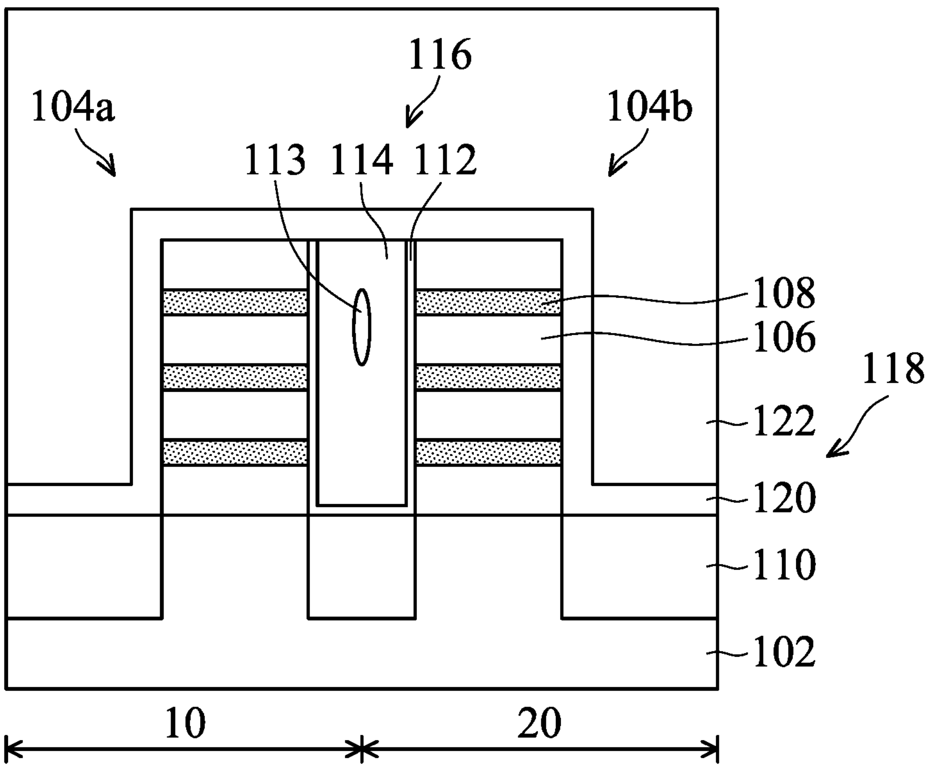
Figures 1, 2G:
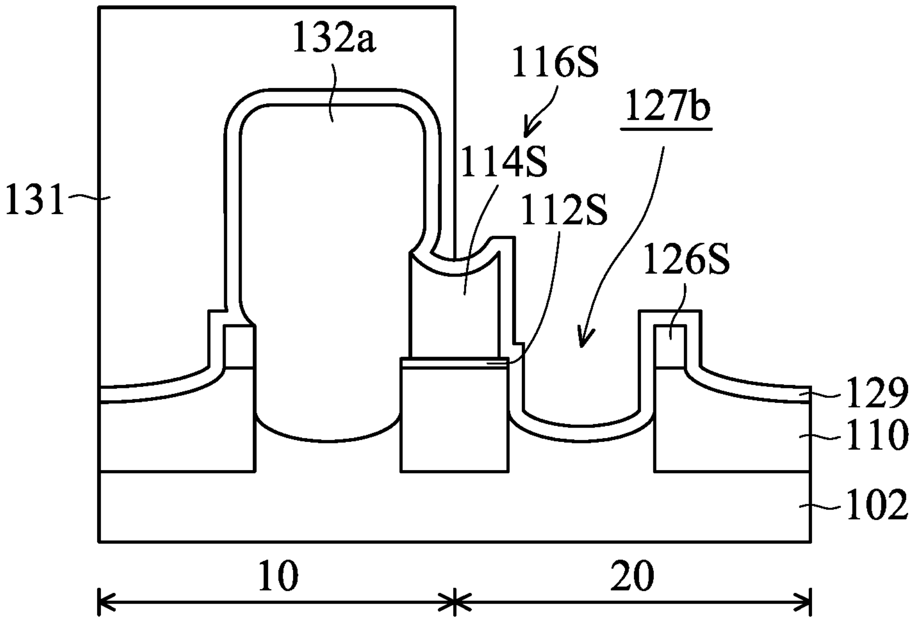
Figures 2, 2G:
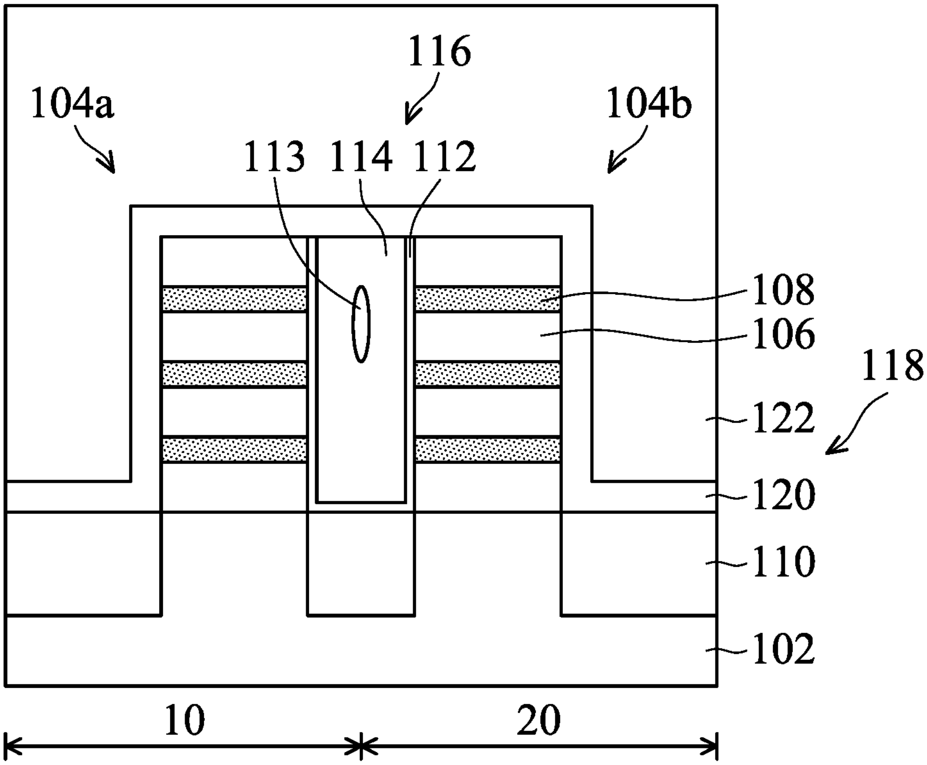
Figures 1, 2H:
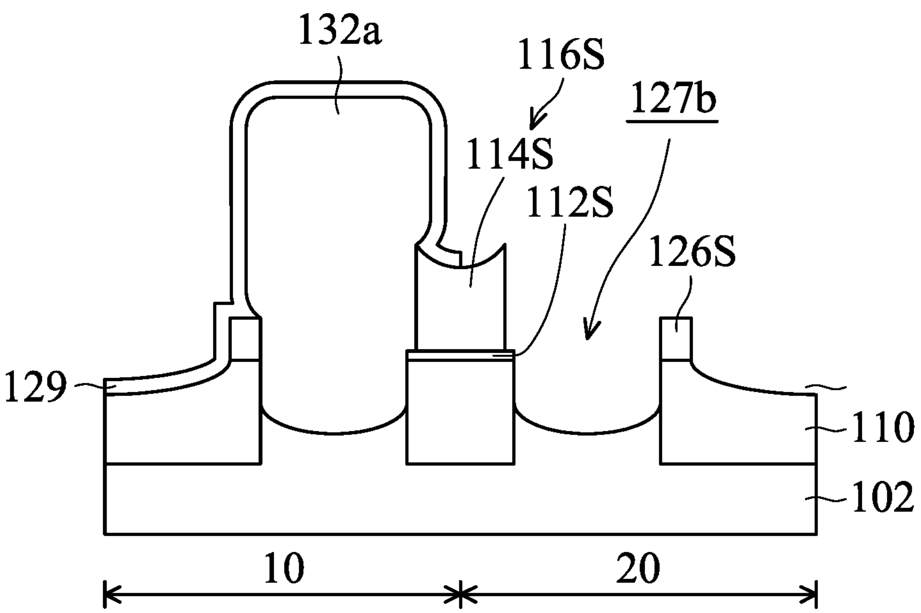
Figures 2, 2H:
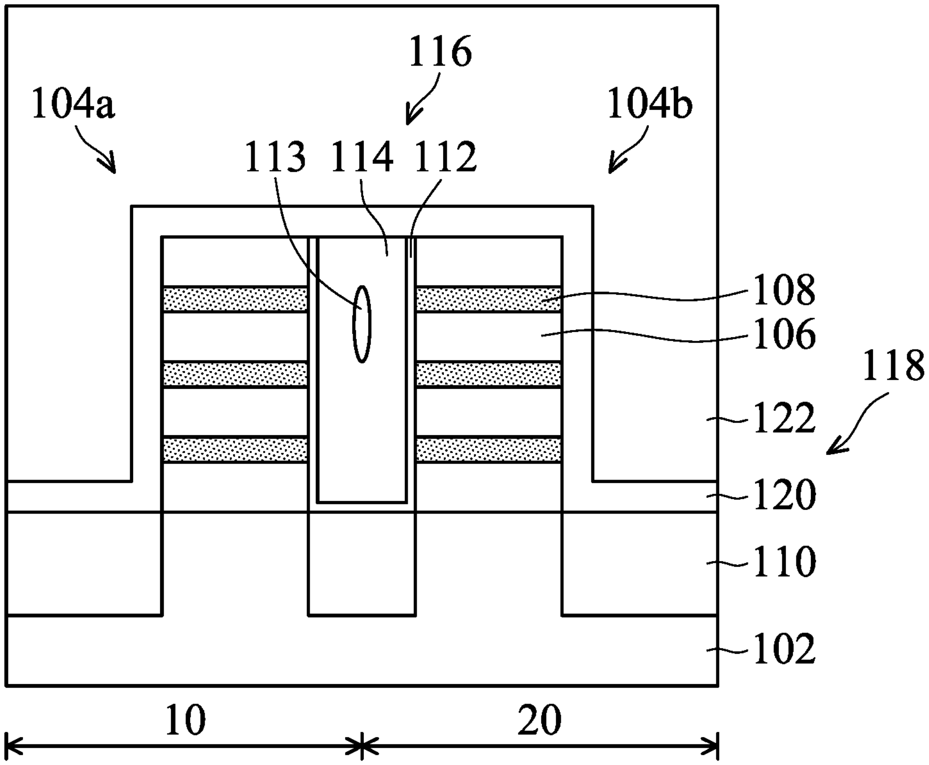
Figures 1, 2I:
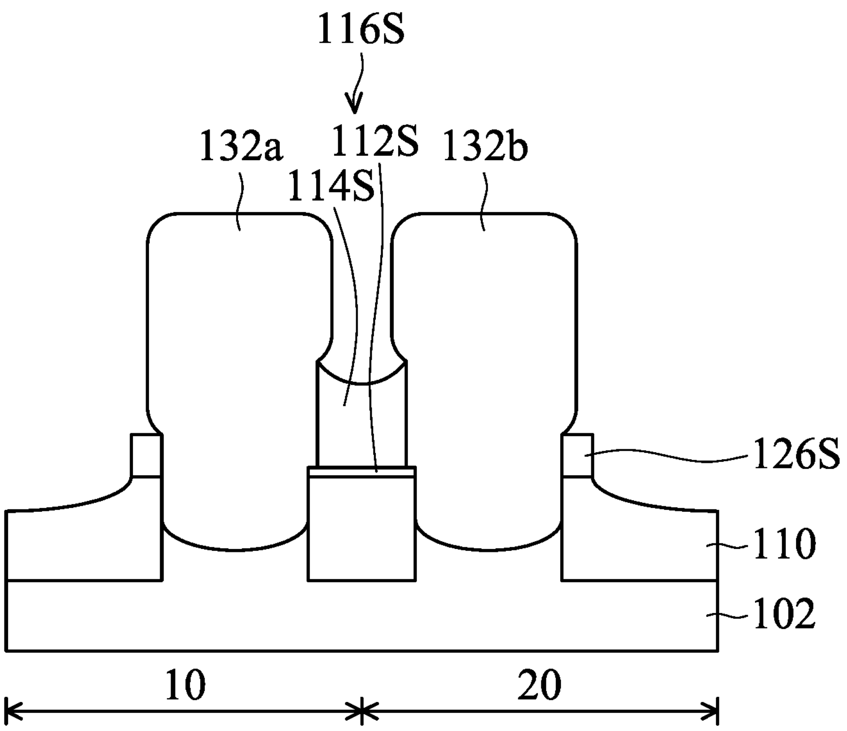
Figures 2, 2I:
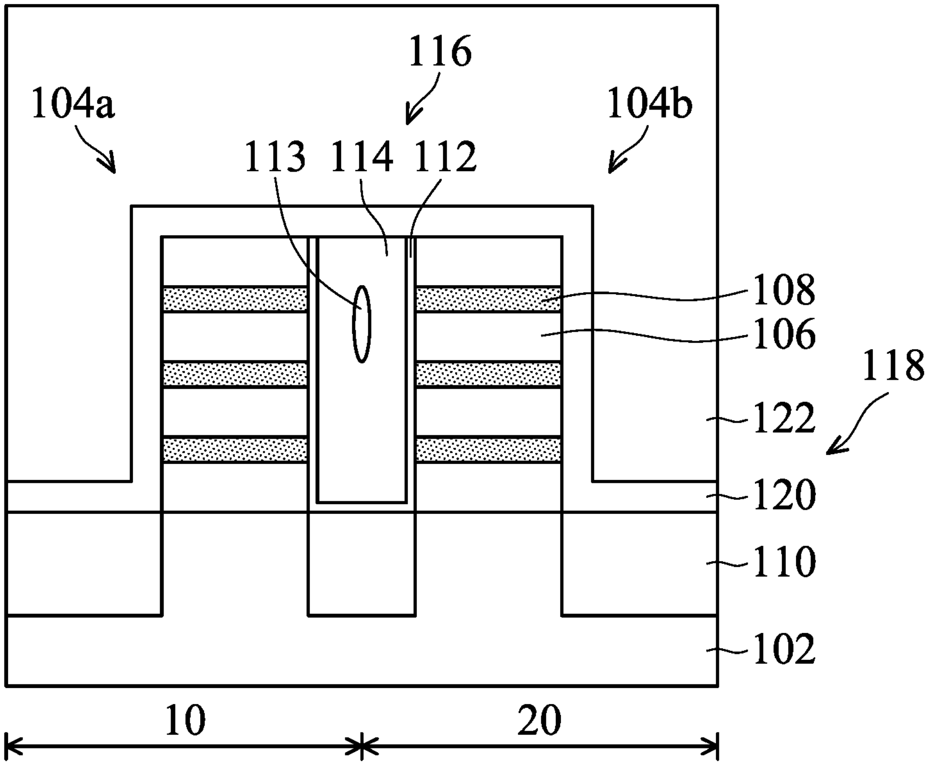
Figures 1, 2J:
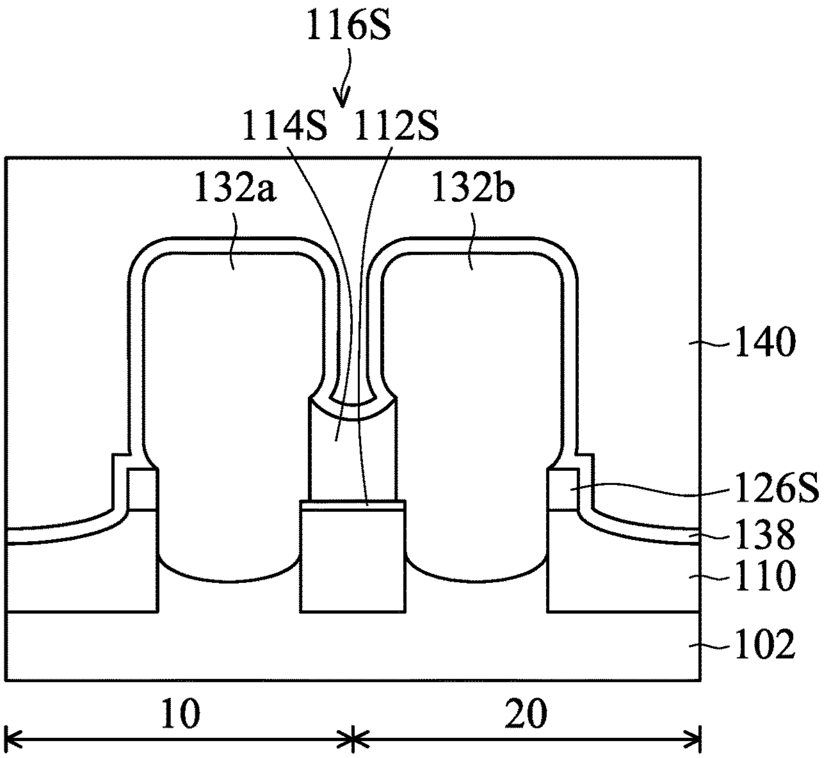
Figures 2, 2J:
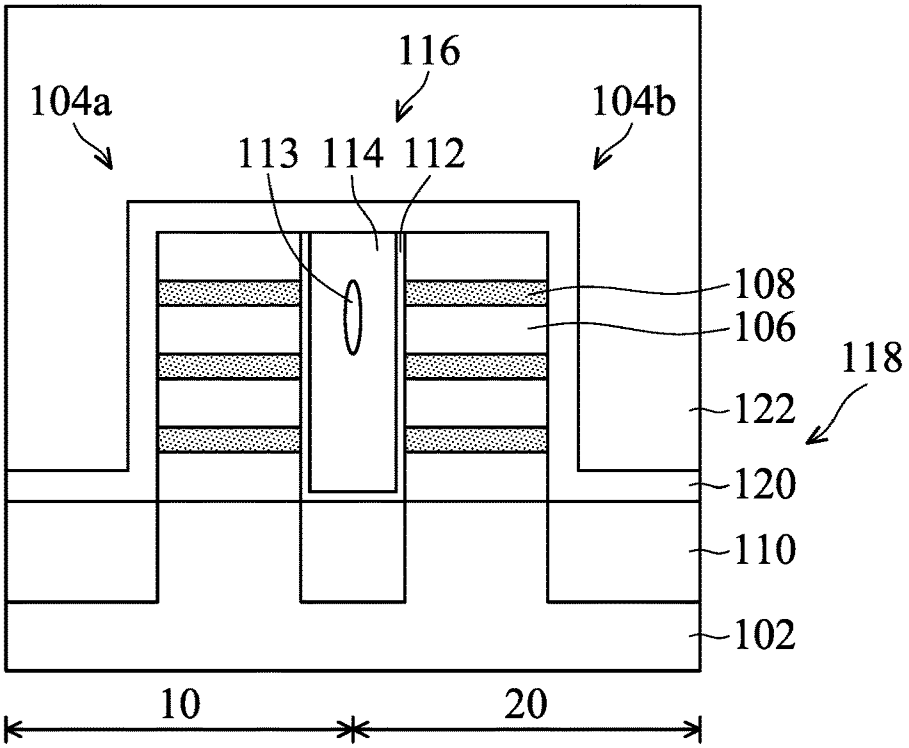
Figures 1, 2K:
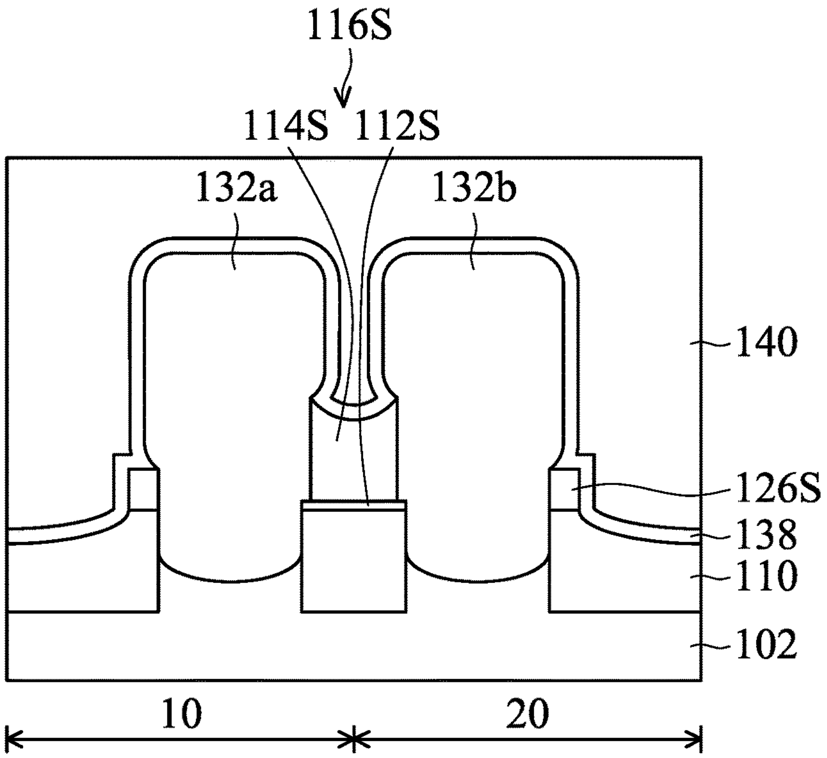
Figures 2, 2K:
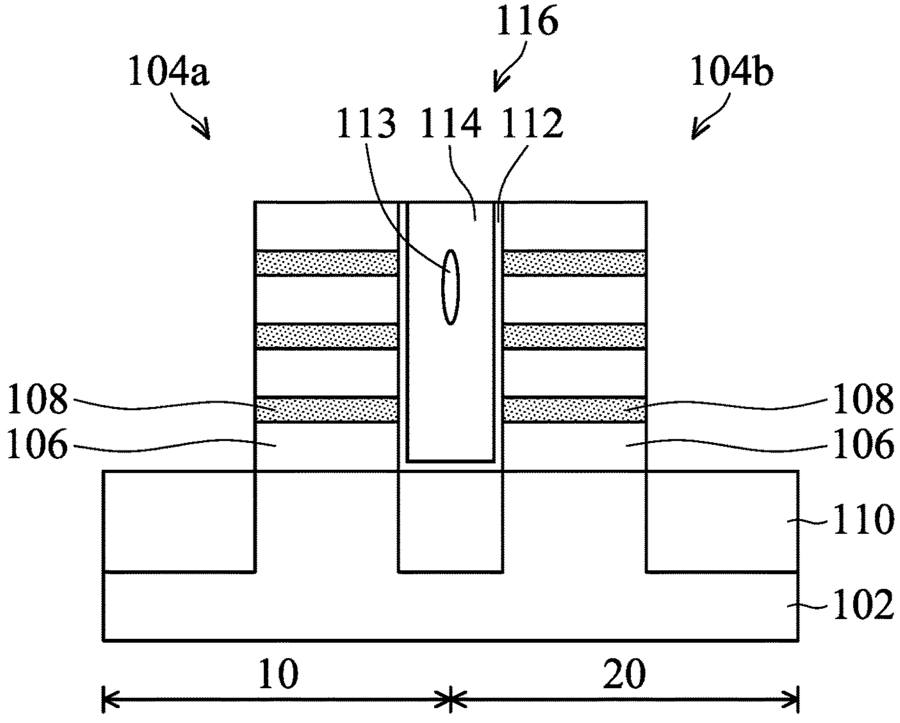
Figures 1, 2L:
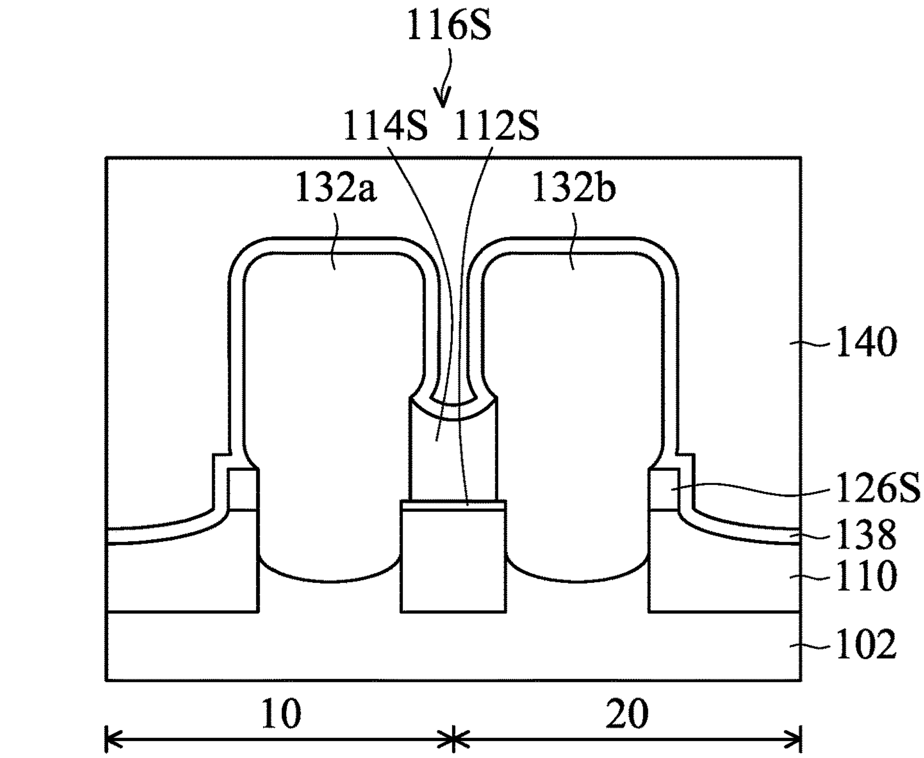
Figures 2, 2L:
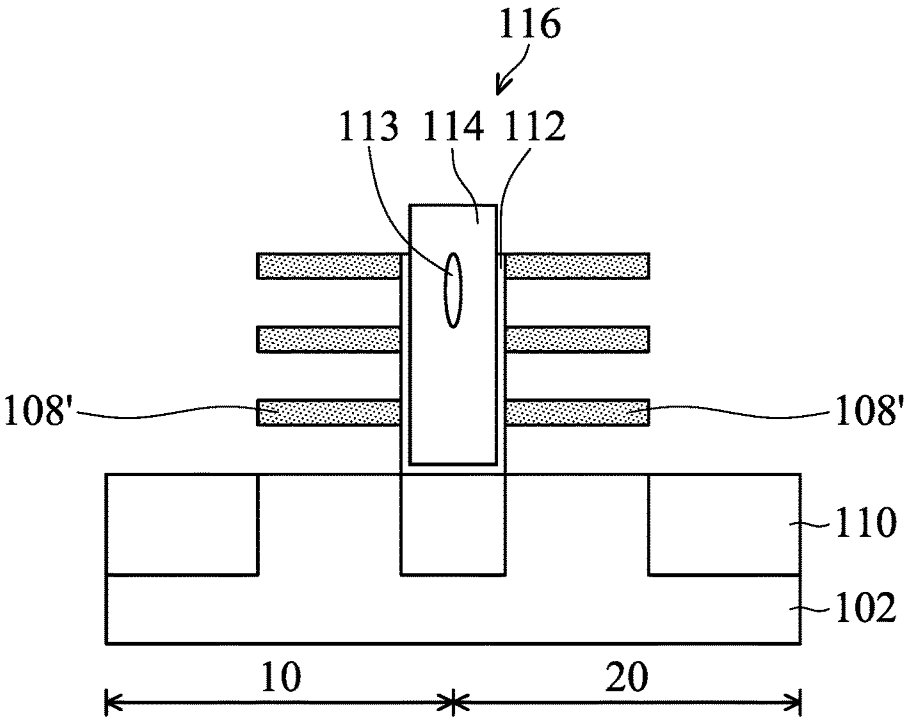
Figures 1, 2M:
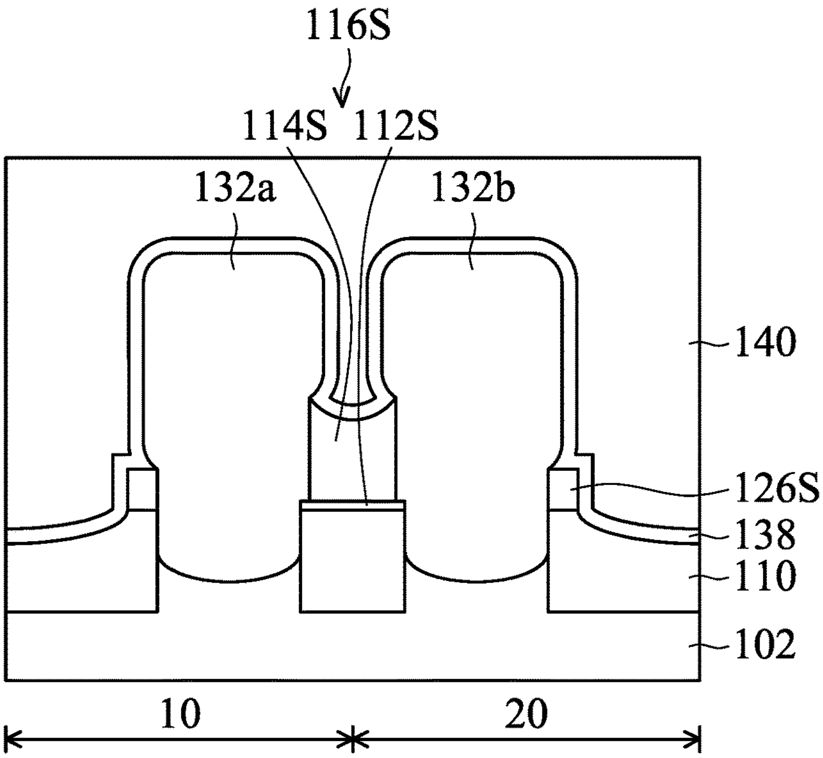
Figures 2, 2M:
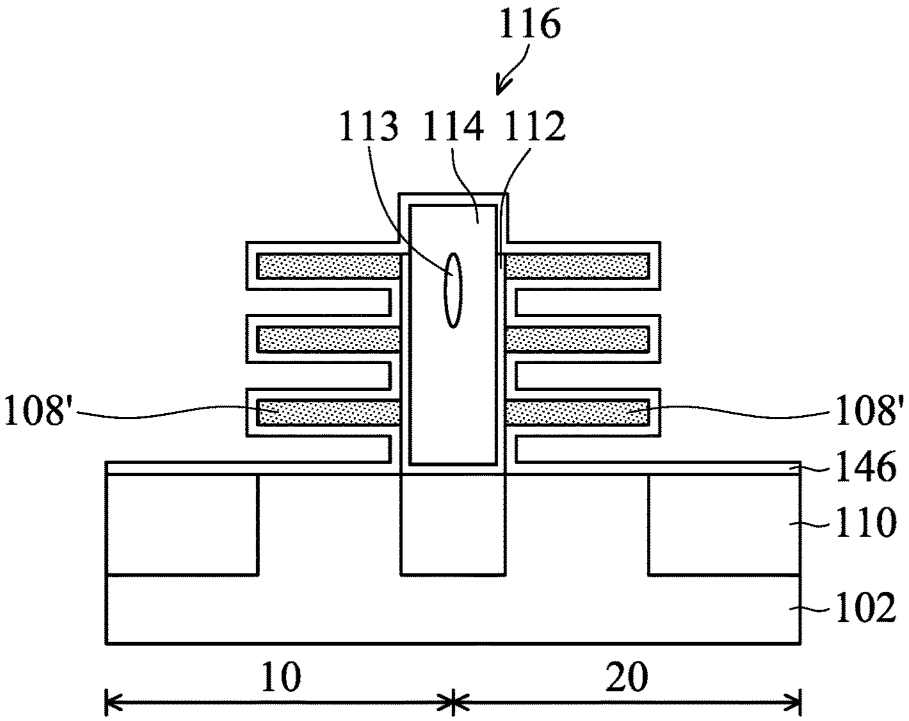
Figures 1, 2N:
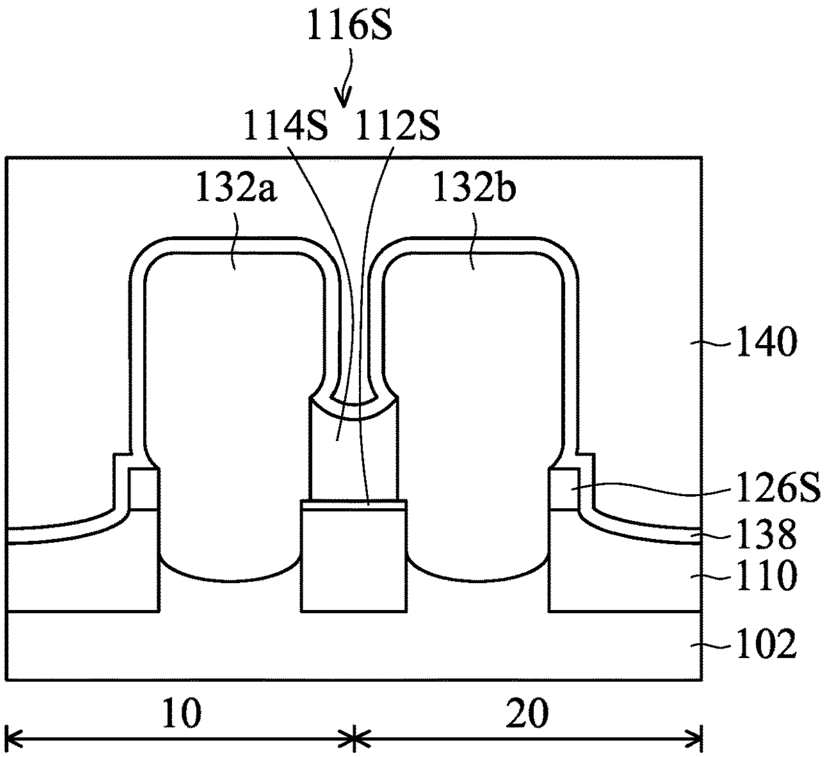
Figures 2, 2N:
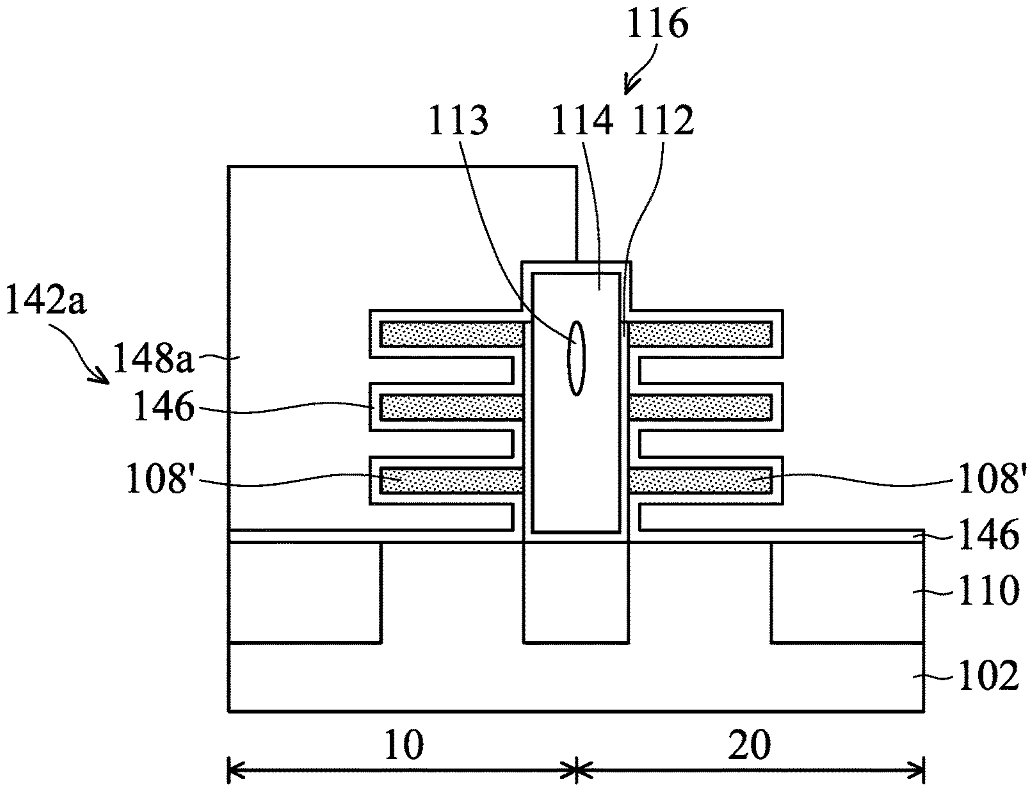
Figures 1, 2O:
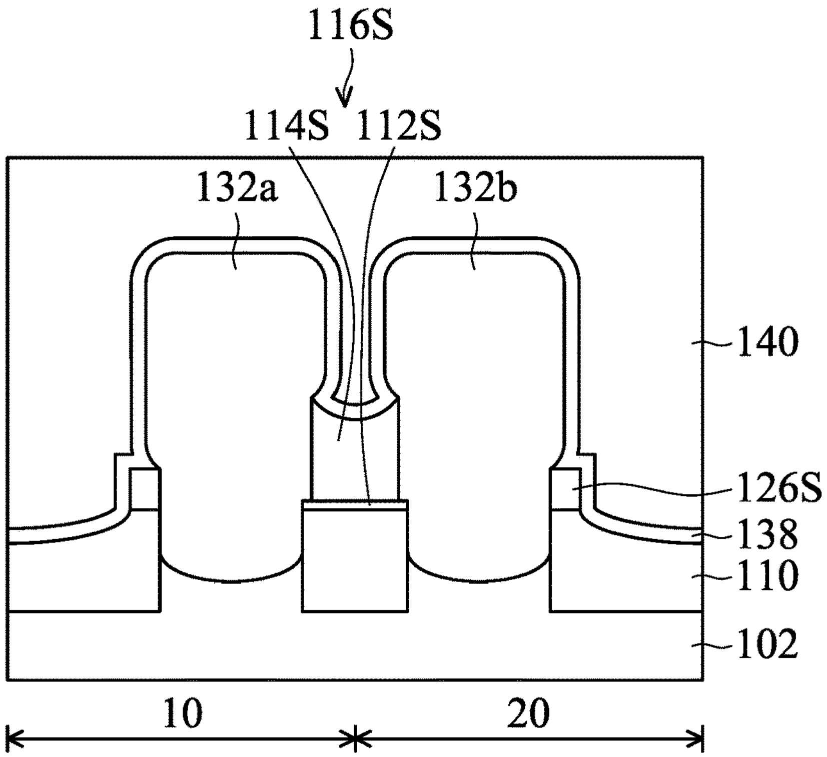
Figures 2, 2O:
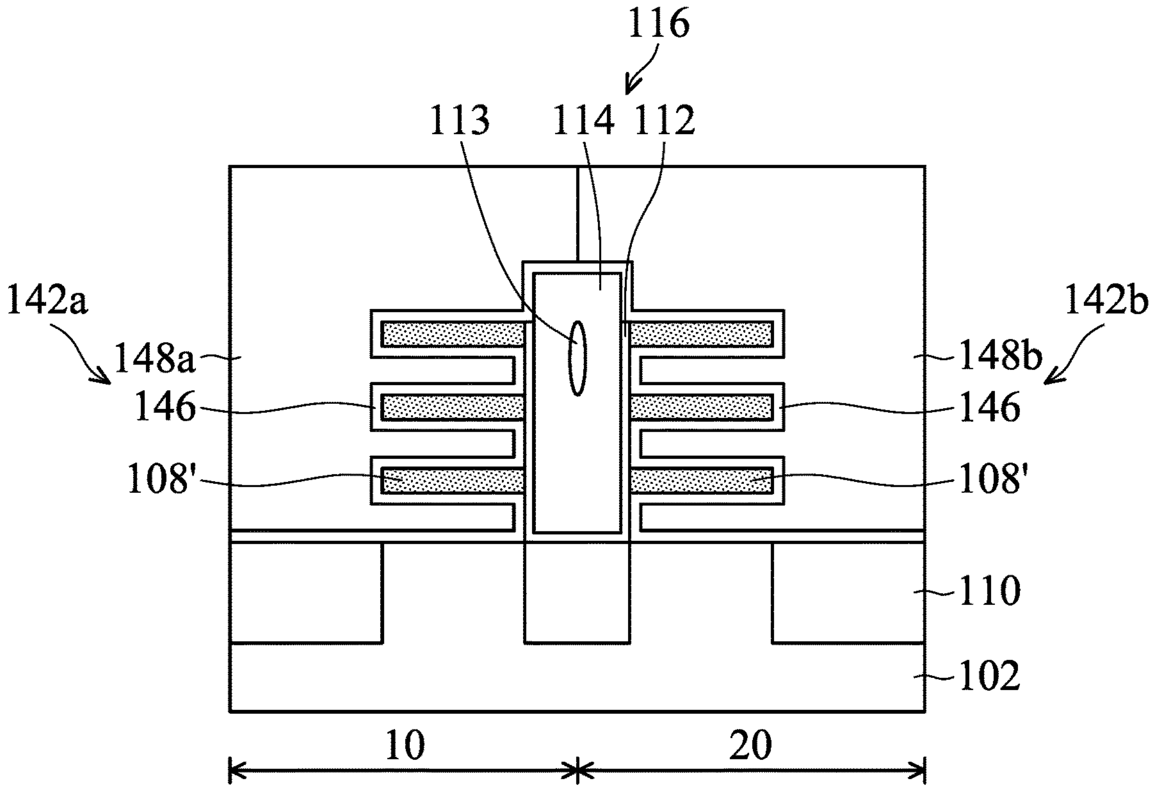
Figures 1, 2P:
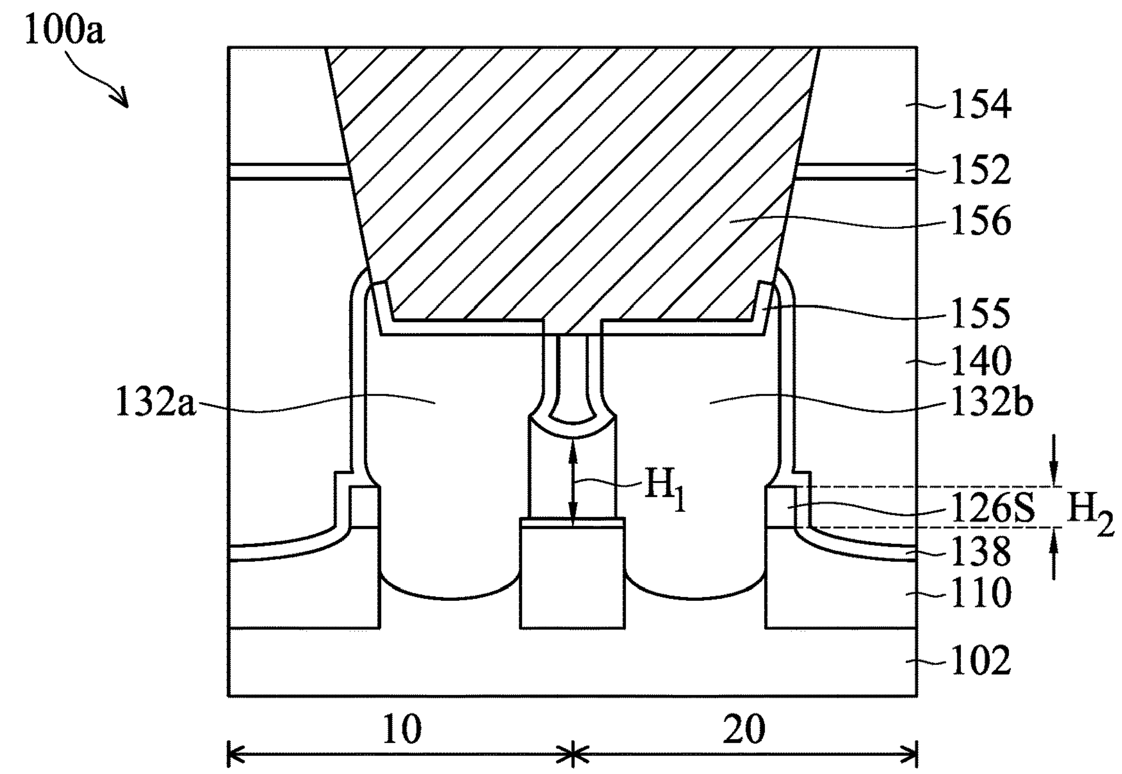
Figures 2, 2P:
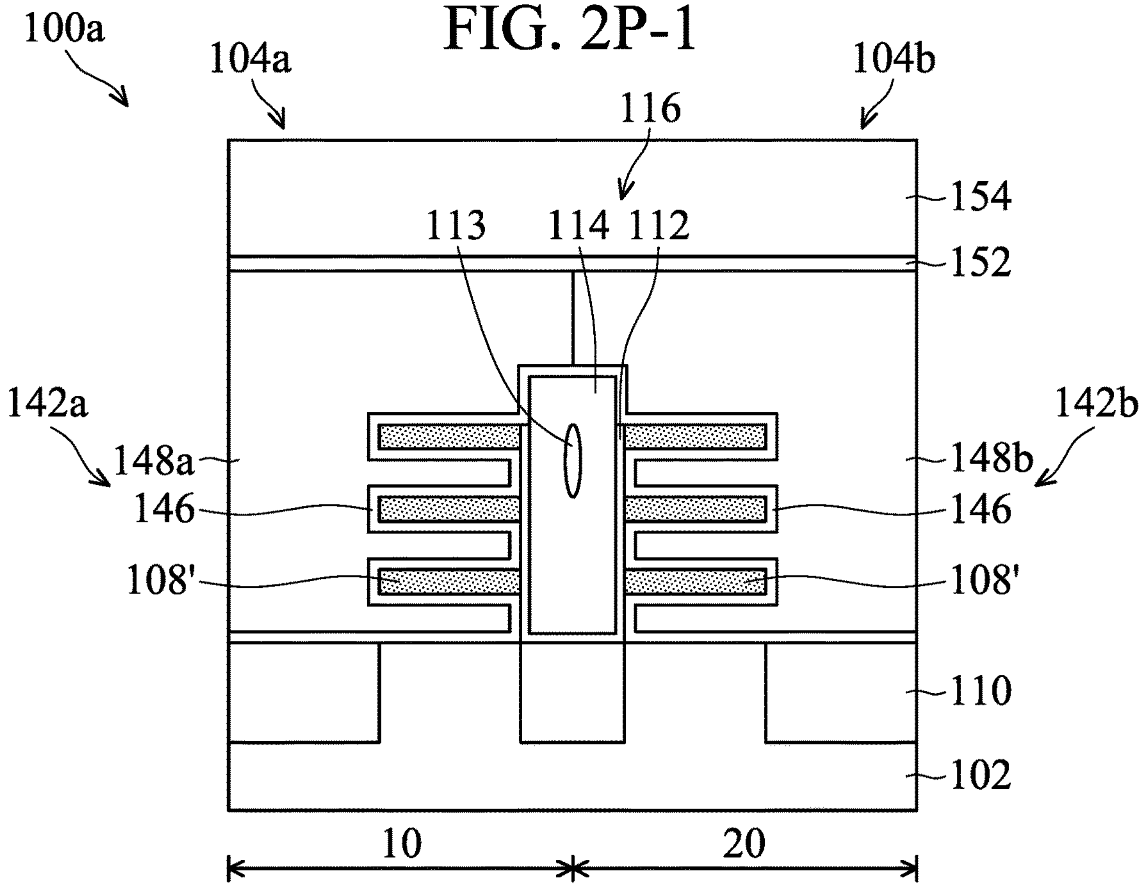

FIGS. 2A-1 to 2P-1 show cross-sectional representations of various stages of manufacturing the semiconductor structure 100*a* shown along line A-A' in FIG. 1E, in accordance with some embodiments. FIGS. 2A-2 to 2P-2 show cross-sectional representations of various stages of manufacturing the semiconductor structure 100*a* shown along line B-B' in FIG. 1E, in accordance with some embodiments. More specifically, FIG. 2A-1 shows the cross-sectional representation shown along line A-A' in FIG. 1E, in accordance with some embodiments. FIG. 2A-2 shows the cross-sectional representation shown along line B-B' in FIG. 1E, in accordance with some embodiments. FIG. 2A-1 shows an S/D region and FIG. 2A-2 shows a gate structure region.

As shown in FIGS. 2A-1 and 2A-2, the substrate 102 includes a first region 10 and a second region 20. The first stack structure 104*a* is formed in the first region 10, and the second stack structure 104*b* is formed in the second region 20. The dielectric wall 116 is between and in direct contact with the first stack structure 104*a* and the second stack structure 104*b*. The liner dielectric layer 114 is in direct contact with the first semiconductor layers 106 and the second semiconductor layers 108. The liner dielectric layer 114 has a U-shaped structure. The dummy gate structure 118 is formed across the first stack structure 104*a* and the second stack structure 104*b* and over the dielectric wall 116. The dummy gate structure 118 includes the dummy gate dielectric layer 120 and the dummy gate electrode layer 122.

Next, as shown in FIGS. 2B-1 and 2B-2, a spacer layer 126 is formed along and covering opposite sidewalls of the dummy gate structure 118 and are formed along and covering opposite sidewalls of the source/drain (S/D) regions of the first stack structure 104*a* and the second stack structure 104*b* and the dielectric wall 116, in accordance with some embodiments. The spacer layer 126 may be configured to constrain a lateral growth of subsequently formed source/drain (S/D) structure (formed later) and support the first stack structure 104*a* and the second stack structure 104*b*.

In some embodiments, the spacer layer 126 is made of a dielectric material, such as silicon oxide ($SiO_2$), silicon nitride (SiN), silicon carbide (SiC), silicon oxynitride (SiON), silicon carbon nitride (SiCN), silicon oxide carbonitride (SiOCN), and/or a combination thereof. In some embodiments, the spacer layer 126 is formed by chemical vapor deposition (CVD), atomic vapor deposition (ALD), physical vapor deposition (PVD), another suitable method, or a combination thereof.

Afterwards, as shown in FIGS. 2C-1 and 2C-2, a portion of the spacer layer 126 is removed to form a shortened spacer layer 126S, and then a portion of the first stack structure 104*a* and the second stack structure 104*b* is removed, in accordance with some embodiments. As a result, a first S/D recess 127*a* and a second S/D recess 127*b* are formed, and the top surfaces of the substrate of the substrate 102 are exposed by the first S/D recess 127*a* and the second S/D recess 127*b*.

Some portions of the first stack structure 104*a* and the second stack structure 104*b* are recessed to form curved top surfaces. The curved top surfaces of the first stack structure 104*a* and the second stack structure 104*b* are lower than the top surface of the isolation structure 110, and lower than the top surface of the shortened spacer layer 126S. In some embodiments, the first stack structure 104*a* and the second stack structure 104*b* are recessed by performing an etching process. The etching process may be an anisotropic etching process, such as dry plasma etching, and the dummy gate structure 118 and the shortened spacer layer 126S are used as etching masks during the etching process.

When the top portion of the spacer layer 126 is removed to form the shortened spacer layer 126S, the top portion of the dielectric wall 116 is simultaneously removed. When the portions of the first stack structure 104*a* and the second stack structure 104*b* are removed, a middle portion of the dielectric wall 116 is simultaneously removed. As a result, a shortened dielectric wall 116S is obtained. The shortened dielectric wall 116S includes a shortened liner dielectric layer 112S and a shortened core dielectric layer 114S below the shortened liner dielectric layer 112S. In addition, a portion of the isolation structure 110 is also removed. It should be noted that the sidewalls of the short ended core dielectric layer 114S are exposed.

The top surface of the shortened dielectric wall 116S is recessed, and therefore the shortened dielectric wall 116S has a concave top surface. The shortened dielectric wall 116S has a first height $H_1$ along the vertical direction, and the shortened spacer layer 126S has a second height $H_2$ along the vertical direction. In some embodiments, the first height $H_1$ of the shortened dielectric wall 116S is greater than the second height $H_2$ of the shortened spacer layer 126S. The shortened dielectric wall 116S is higher than the shortened spacer layer 126S. In other words, the second height $H_2$ of the shortened spacer layer 126S is smaller than the first height $H_1$ of the shortened dielectric wall 116S. In some embodiments, the first height $H_1$ is in a range from about 10 nm to about 40 nm. In some embodiments, the second height $H_2$ is in a range from about 0 nm to about 30 nm. In some other embodiments, there is no spacer layer 126 adjacent to the shortened dielectric wall 116S.

Next, as shown in FIGS. 2D-1 and 2D-2, a hard mask layer 129 is formed on the shortened spacer layer 126S, the shortened dielectric wall 116S, the first stack structure 104*a*, the second stack structure 104*b*, and isolation structure 110, in accordance with some embodiments. Next, a photoresist layer 131 is formed over a portion of the hard mask layer 129. The photoresist layer 131 is patterned to form a patterned photoresist layer 131 to transfer the pattern to the hard mask layer 129. The patterned photoresist layer 131 is formed in the second region 20.

The spacer layer 126 has a high etching selectivity with respect to the hard mask layer 129. In addition, the shortened dielectric wall 116S has a high etching selectivity with respect to the hard mask layer 129. When the hard mask layer 129 is removed, the spacer layer 126 and the shortened dielectric wall 116S are rarely removed. In some embodiments, the hard mask layer 129 is made of nitride or oxide, such as silicon nitride or aluminum oxide ($Al_2O_3$) or another applicable material. In some embodiments, the hard mask layer 129 is formed by chemical vapor deposition (CVD), atomic vapor deposition (ALD), physical vapor deposition (PVD), another suitable method, or a combination thereof.

Afterwards, as shown in FIGS. 2E-1 and 2E-2, a portion of the hard mask layer 129 in the first region 10 which is not coved by the photoresist layer 131 is removed to expose the first S/D recess 127*a*, and then the photoresist layer 131 is removed, in accordance with some embodiments. The remaining hard mask layer 129 is still in the second region 20.

Next, as shown in FIGS. 2F-1 and 2F-2, a first S/D structure 132*a* is formed in the first S/D recess 127*a* in the first region 10, in accordance with some embodiments. The first S/D structure 132*a* extends above the top surface of shortened dielectric wall 116S. In addition, the first S/D structure 132*a* is in direct contact with the shortened dielectric wall 116S. The first S/D structure 132*a* is in direct contact with the sidewall and the top surface of the shortened dielectric wall 116S.

In some embodiments, the first S/D structures 132*a* is made of any applicable material, such as Ge, Si, GaAs, AlGaAs, SiGe, GaAsP, SiP, SiC, SiCP, or a combination thereof. In some embodiments, the first S/D structure 132*a* is formed using an epitaxial growth process, such as Molecular beam epitaxy (MBE), Metal-organic Chemical Vapor Deposition (MOCVD), Vapor-Phase Epitaxy (VPE), other applicable epitaxial growth process, or a combination thereof.

In some embodiments, the first S/D structure 132*a* is in-situ doped during the epitaxial growth process. For example, the first S/D structure 132*a* may be the epitaxially grown SiGe doped with boron (B). For example, the first S/D structure 132*a* may be the epitaxially grown Si doped with carbon to form silicon:carbon (Si:C) source/drain features, phosphorous to form silicon:phosphor (Si:P) source/drain features, or both carbon and phosphorous to form silicon carbon phosphor (SiCP) source/drain features. In some embodiments, the first S/D structures 132*a* are doped in one or more implantation processes after the epitaxial growth process.

Afterwards, as shown in FIGS. 2G-1 and 2G-2, the hard mask layer 129 is again formed on the shortened spacer layer 126S, the shortened dielectric wall 116S, the isolation structure 110 and the first S/D structure 132*a*, in accordance with some embodiments. Next, the photoresist layer 131 is formed over a portion of the hard mask layer 129 in the first region 10, and the photoresist layer 131 is patterned to form a patterned photoresist layer 131. The patterned photoresist layer 131 is in the first region 10.

Next, as shown in FIGS. 2H-1 and 2H-2, a portion of the hard mask layer 129 is removed to expose the second S/D recess 127*b* in the second region 20, in accordance with some embodiments. The remaining hard mask layer 129 is used to protect the first S/D structure 132*a*. Next, the photoresist layer 131 is removed.

Afterwards, as shown in FIGS. 2I-1 and 2I-2, a second S/D structure 132*b* is formed in the second S/D recess 127*b* in the second region 20, in accordance with some embodiments. Next, the hard mask layer 129 is removed after the second S/D structure 132*b* is formed. The second S/D structure 132*b* extends above the top surface of shortened dielectric wall 116S. In addition, the second S/D structure 132*b* is in direct contact with the shortened dielectric wall 116S. The second S/D structure 132*b* is in direct contact with the sidewalls and the top surface of the shortened dielectric wall 116S.

In some embodiments, the second S/D structures 132*b* is made of any applicable material, such as Ge, Si, GaAs, AlGaAs, SiGe, GaAsP, SiP, SiC, SiCP, or a combination thereof. In some embodiments, the second S/D structure 132*b* is formed using an epitaxial growth process, such as Molecular beam epitaxy (MBE), Metal-organic Chemical Vapor Deposition (MOCVD), Vapor-Phase Epitaxy (VPE), other applicable epitaxial growth process, or a combination thereof.

In some embodiments, the second S/D structure 132*b* is in-situ doped during the epitaxial growth process. For example, the second S/D structure 132*b* may be the epitaxially grown SiGe doped with boron (B). For example, the second S/D structure 132*b* may be the epitaxially grown Si doped with carbon to form silicon:carbon (Si:C) source/drain features, phosphorous to form silicon:phosphor (Si:P) source/drain features, or both carbon and phosphorous to form silicon carbon phosphor (SiCP) source/drain features. In some embodiments, the second S/D structures 132*b* are doped in one or more implantation processes after the epitaxial growth process.

Next, as shown in FIGS. 2J-1 and 2J-2, after the first S/D structure 132*a* and second S/D structures 132*b* are formed, a contact etch stop layer (CESL) 138 is conformally formed to cover the S/D structures 136 and an interlayer dielectric (ILD) layer 140 is formed over the contact etch stop layers 138, in accordance with some embodiments.

It should be noted that the space between the first S/D structure 132*a* and the second S/D structure 132*b* is filled with the CESL 138. The CESL 138 is in direct contact with the top surface of the shortened dielectric wall 116S.

In some embodiments, the CESL 138 is made of a dielectric materials, such as silicon nitride, silicon oxide, silicon oxynitride, another suitable dielectric material, or a combination thereof. The dielectric material for the CESL 138 may be conformally deposited over the semiconductor structure by performing chemical vapor deposition (CVD), ALD, other application methods, or a combination thereof.

The ILD layer 140 may include multilayers made of multiple dielectric materials, such as silicon oxide, silicon nitride, silicon oxynitride, phosphosilicate glass (PSG), borophosphosilicate glass (BPSG), and/or other applicable low-k dielectric materials. The ILD layer 140 may be formed by chemical vapor deposition (CVD), physical vapor deposition, (PVD), atomic layer deposition (ALD), or other applicable processes.

After the CESL 138 and the ILD layer 140 are deposited, a planarization process such as CMP or an etch-back process may be performed until the gate electrode layers 120 of the dummy gate structures 118 are exposed, as shown in FIG. 2J-2, in accordance with some embodiments.

Next, as shown in FIGS. 2K-1 and 2K-2, the dummy gate structure 118 is removed to exposed the first stack structure 104*a* and the second stack structure 104*b*, in accordance with some embodiments. As a result, the dielectric wall 116 is exposed. It should be noted that, the dielectric wall 116 along line B-B' in FIG. 1E, is directly below the dummy gate structure 118 and protected by the dummy gate structure 118, it is not removed when the process for forming the first S/D structure 132*a* and the second S/D structure 132*b*.

The removal process may include one or more etching processes. For example, when the dummy gate electrode layer 122 is polysilicon, a wet etchant such as a tetramethylammonium hydroxide (TMAH) solution may be used to selectively remove the dummy gate electrode layer 122. Afterwards, the dummy gate dielectric layer 120 may be removed using a plasma dry etching, a dry chemical etching, and/or a wet etching.

Next, as shown in FIGS. 2L-1 and 2L-2, the first semiconductor material layers 106 are removed to form nanostructures 108' with the second semiconductor material layers 108, in accordance with some embodiments. The first S/D structure 132*a* and the second S/D structure 132*b* are attached to the nanostructures 108'. In addition, the top portion of the liner dielectric layer 112 of the dielectric wall 116 is removed to expose the top surface of the core dielectric layer 114. The topmost surface of the core dielectric layer 114 is higher than the topmost surface of the liner dielectric layer 112 of the dielectric wall 116. The nanostructures 108' are connected to the dielectric wall 116 by the liner dielectric layer 114.

The first semiconductor material layers 106 may be removed by performing a selective wet etching process, such as APM (e.g., ammonia hydroxide-hydrogen peroxide-water mixture) etching process. For example, the wet etching process uses etchants such as ammonium hydroxide ($NH_4OH$), TMAH, ethylenediamine pyrocatechol (EDP), and/or potassium hydroxide (KOH) solutions.

Next, as shown in FIGS. 2M-1 and 2M-2, after the nanostructures 108' are formed, a gate dielectric layer 146 is formed to surround the nanostructures 108' and over the isolation structure 110, in accordance with some embodiments. Furthermore, an interfacial layer (not shown) may be formed before forming the gate dielectric layer 146. The gate dielectric layer 146 is in direct contact with the liner dielectric layer 112 of the dielectric wall 116.

In some embodiments, the interfacial layer is oxide layer formed around the nanostructures 108'. In some embodiments, the interfacial layer is formed by performing a thermal process. In some embodiments, the gate dielectric layers 146 are formed over the interfacial layers 144, so that the nanostructures 108' are surrounded (e.g. wrapped) by the gate dielectric layers 146. In some embodiments, the gate dielectric layers 146 are made of one or more layers of dielectric materials, such as $HfO_2$, HfSiO, HfSiON, HfTaO, HfSiO, HfZrO, zirconium oxide, aluminum oxide, titanium oxide, hafnium dioxide-alumina ($HfO_2$—$Al_2O_3$) alloy, another suitable high-k dielectric material, or a combination thereof. In some embodiments, the gate dielectric layers 146 are formed using chemical vapor deposition (CVD), atomic layer deposition (ALD), another applicable method, or a combination thereof.

Next, as shown in FIGS. 2N-1 and 2N-2, a first gate electrode layer 148*a* is formed in the first region 10 to surround the nanostructures 108', in accordance with some embodiments. A first gate structure 142*a* is constructed by the interfacial layer (not shown), the gate dielectric layer 146, and the first gate electrode layer 148*a*.

The first gate structure 142*a* wraps around the nanostructures 108' to form gate-all-around transistor structures. In some embodiments, the first gate electrode layer 148*a* is formed on the gate dielectric layer 146. In some embodiments, the first gate electrode layer 148*a* is made of one or more layers of conductive material, such as aluminum, copper, titanium, tantalum, tungsten, cobalt, molybdenum, tantalum nitride, nickel silicide, cobalt silicide, TiN, WN, TiAl, TiAlN, TaCN, TaC, TaSiN, metal alloys, another suitable material, or a combination thereof. In some embodiments, the first gate electrode layer 148*a* is formed using chemical vapor deposition (CVD), atomic layer deposition (ALD), electroplating, another applicable method, or a combination thereof.

Other conductive layers, such as work function metal layers, may also be formed in the first gate structure 142*a*, although they are not shown in the figures. In some embodiments, the n-work function layer includes tungsten (W), copper (Cu), titanium (Ti), silver (Ag), aluminum (Al), titanium nitride (TiN), tantalum nitride (TaN), tantalum carbide (TaC), titanium aluminum alloy (TiAl), titanium aluminum nitride (TiAlN), tantalum carbon nitride (TaCN), tantalum silicon nitride (TaSiN), manganese (Mn), zirconium (Zr) or a combination thereof. In some embodiments, the p-work function layer includes titanium (Ti), titanium nitride (TiN), tantalum nitride (TaN), tantalum carbide (TaC), molybdenum nitride, tungsten nitride (WN), ruthenium (Ru) or a combination thereof.

Next, as shown in FIGS. 2O-1 and 2O-2, a second gate electrode layer 148*b* is formed in the second region 20 to surround the nanostructures 108', in accordance with some embodiments. A second gate structure 142*b* is constructed by the interfacial layer (not shown), the gate dielectric layer 146, and the second gate electrode layer 148*b*. The material of the second gate electrode layer 148*b* is different from that of the first gate electrode layer 148*a*. There is an interface between the first gate electrode layer 148*a* and the second gate electrode layer 148*b*.

The second gate structure 142*b* wraps around the nanostructures 108' to form gate-all-around transistor structures. In some embodiments, the second gate electrode layer 148*b* is formed on the gate dielectric layer 146. In some embodiments, the second gate electrode layer 148*b* is made of one or more layers of conductive material, such as aluminum, copper, titanium, tantalum, tungsten, cobalt, molybdenum, tantalum nitride, nickel silicide, cobalt silicide, TiN, WN, TiAl, TiAlN, TaCN, TaC, TaSiN, metal alloys, another suitable material, or a combination thereof. In some embodiments, the second gate electrode layer 148*b* is formed using chemical vapor deposition (CVD), atomic layer deposition (ALD), electroplating, another applicable method, or a combination thereof.

Figures 2, 2P, 3:
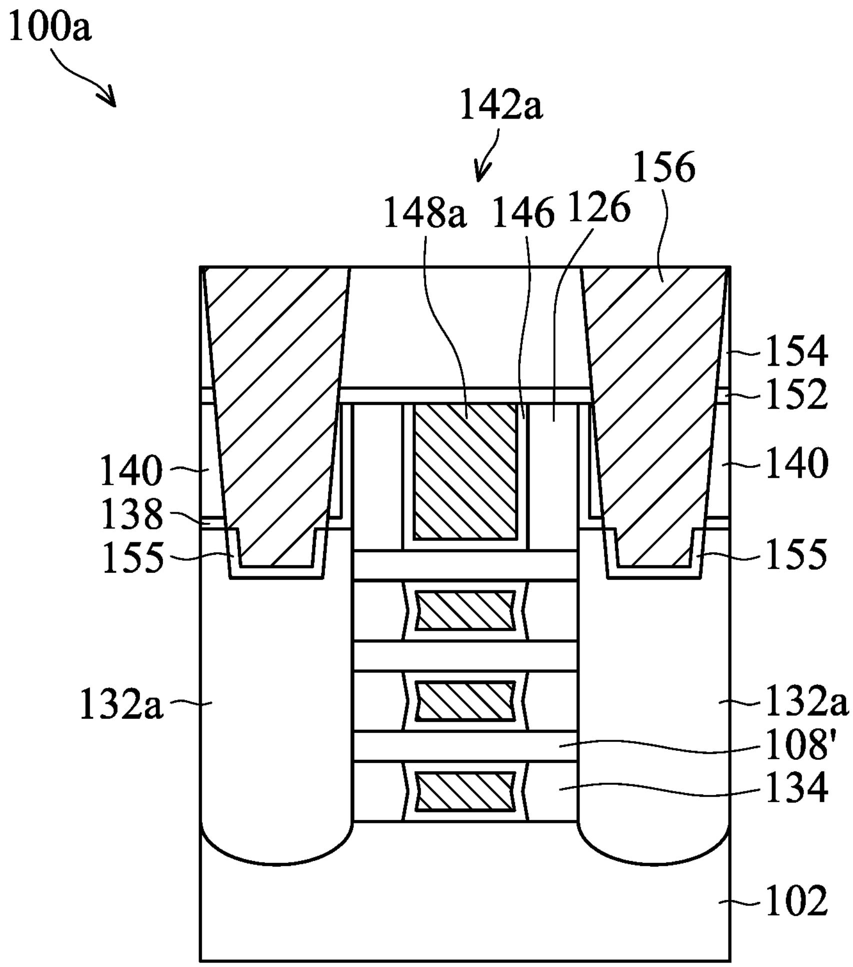

FIG. 3 shows a perspective view of the semiconductor structure 100*a* after FIGS. 2O-1 and 2O-2, in accordance with some embodiments. More specifically, FIG. 2P-1 shows the cross-sectional representation shown along line I-I' in FIG. 3, in accordance with some embodiments. FIG. 2P-2 shows the cross-sectional representation shown along line II-II' in FIG. 3, in accordance with some embodiments. FIG. 2P-3 shows the cross-sectional representation shown along line III-III' in FIG. 3, in accordance with some embodiments. FIG. 2P-4 shows the cross-sectional representation shown along line IV-IV' in FIG. 3, in accordance with some embodiments.

Next, as shown in FIGS. 2P-1 and 2P-2, an etching stop layer 152 is formed over the ILD layer 140 and the first gate structure 142*a* and the second gate structure 142*b*, in accordance with some embodiments. Next, an ILD layer 154 is formed over the etching stop layer 152. Afterwards, a portion of the ILD layer 154, a portion of the etching stop layer 152 and a portion of the first S/D structure 152*a*, and a portion of the second S/D structure 152*b* are removed to form a trench (not shown). The top surfaces of the first S/D structure 152*a* and the top surface of the second S/D structure 152*b* are exposed by the trench. Next, a silicide layer 155 and an SID contact structure 156 are formed over the first S/D structure 132*a* and the second S/D structure 132*b*.

In some embodiments, the contact openings is formed through the CESL 138, the ILD layer 140, the etching stop layer 152 and the ILD layer 154 to expose the top surfaces of the first S/D structures 132*a*, and then the silicide layer 155 and the S/D contact structure 156 is formed in the contact openings. The contact openings may be formed using a photolithography process and an etching process. In addition, some portions of the first S/D structures 132*a* exposed by the contact openings may also be etched during the etching process.

After the contact openings are formed, the silicide layer 155 may be formed by forming a metal layer over the top surface of the first S/D structures 132*a* and annealing the metal layer so the metal layer reacts with the first S/D structures 132*a* to form the silicide layer 155. The unreacted metal layer may be removed after the silicide layers 155 are formed.

The shortened dielectric wall 116S is between the first S/D structure 132*a* and the second S/D structure 132*b*. The first S/D structure 132*a* extends above the top surface of the shortened dielectric wall 116S. In addition, the bottom surface of the S/D contact structure 156 is higher than the top surface of the shortened dielectric wall 116S. The S/D contact structure 156 is separated from the shortened dielectric wall 116S by the CESL 138 and the ILD layer 140. The S/D contact structure 156 is not in direct contact with the shortened dielectric wall 116S. Furthermore, a portion of the ILD layer 140 directly below the S/D contact structure 156 and surrounded by the CESL 138.

The S/D contact structure 156 may include a barrier layer and a conductive layer. In some embodiments, the barrier layer is made of titanium (Ti), titanium nitride (TiN), tantalum (Ta), tantalum nitride (TaN), or another applicable material. In some embodiments, the barrier layer is formed by using a process such as chemical vapor deposition (CVD), physical vapor deposition (PVD), plasma enhanced CVD (PECVD), plasma enhanced physical vapor deposition (PEPVD), atomic layer deposition (ALD), or any other applicable deposition processes. In some embodiments, the conductive layer is made of tungsten (W), ruthenium (Ru), molybdenum (Mo), or the like. In some embodiments, the conductive layer is formed by performing a deposition process, such as chemical vapor deposition (CVD), physical vapor deposition, (PVD), atomic layer deposition (ALD), or other applicable processes.

In some embodiments, the etching stop layer 152 is made of a dielectric materials, such as silicon nitride, silicon oxide, silicon oxynitride, another suitable dielectric material, or a combination thereof. The dielectric material for the etching stop layer 152 may be conformally deposited over the semiconductor structure by performing chemical vapor deposition (CVD), ALD, other application methods, or a combination thereof.

The ILD layer 154 may include multilayers made of multiple dielectric materials, such as silicon oxide, silicon nitride, silicon oxynitride, phosphosilicate glass (PSG), borophosphosilicate glass (BPSG), and/or other applicable low-k dielectric materials. The ILD layer 154 may be formed by chemical vapor deposition (CVD), physical vapor deposition, (PVD), atomic layer deposition (ALD), or other applicable processes.

As shown in FIG. 2P-2, the dielectric wall 116 is between the first stack structure 104*a* including nanostructures 108' and the second stack structure 104*b* including nanostructures 108'. The top surface of the dielectric wall 116 is higher than the topmost nanostructure 108' of the first stack structure and the second stack structure. The dielectric wall 116 is in direct contact with the nanostructures 108' of the first stack structure and the nanostructures 108' of the second stack structure. More specifically, the liner dielectric layer 112 of the dielectric wall 116 is in direct contact with the nanostructures 108' of the first stack structure and the nanostructures 108' of the second stack structure.

As shown in FIG. 2P-3, an inner spacer layer 134 is formed between the first gate structure 142*a* and the first S/D structure 132*a*. The inner spacer layer 134 is formed after the step for formation of the first S/D recess 127*a* and before the step for formation of the first S/D structure 132*a*.

After the first S/D recess 127*a* is formed, the first semiconductor material layers 106 exposed by the first S/D recess 127*a* are laterally recessed to form notches (not shown). In some embodiments, an etching process is performed on the semiconductor structure 100*a* to laterally recess the first semiconductor material layers 106 of the fin structure 104 from the first S/D recess 127*a*. In some embodiments, during the etching process, the first semiconductor material layers 106 have a greater etching rate (or etching amount) than the second semiconductor material layers 108, thereby forming notches (not shown) between adjacent second semiconductor material layers 108. In some embodiments, the etching process is an isotropic etching such as dry chemical etching, remote plasma etching, wet chemical etching, another suitable technique, and/or a combination thereof.

Next, the inner spacers 134 are formed in the notches between the second semiconductor material layers 108. The inner spacers 134 are configured to separate first the S/D structure 132*a* and the first gate structure 142*a*.

In some embodiments, the inner spacers 134 are made of a dielectric material, such as silicon oxide ($SiO_2$), silicon nitride (SiN), silicon carbide (SiC), silicon oxynitride (SiON), silicon carbon nitride (SiCN), silicon oxide carbonitride (SiOCN), or a combination thereof. In some embodiments, the inner spacer layer 134 is formed by a deposition process, such as chemical vapor deposition (CVD) process, atomic layer deposition (ALD) process, another applicable process, or a combination thereof.

As shown in FIG. 2P-4, the dielectric wall 116 has two portions including the first portion and the second portion. The first portion is directly below the S/D contact structure 156, and the second portion is directly below the first gate structure 142*a*. The first portion of the dielectric wall 116 is the shortened dielectric wall 116S with shortened liner dielectric layer 112S and the shortened core dielectric layer 114S. The first portion of the dielectric wall 116 has the first height $H_1$ along the vertical direction, the second portion of the dielectric wall 116 has a third height $H_3$ along the vertical direction, and the first height $H_1$ is smaller than the third portion $H_3$. In some embodiments, the difference between the third height $H_3$ and first height $H_1$ is in a range from about 10 nm to about 60 nm.

If the dielectric wall 116 is higher than the first S/D structure 132*a*, during forming the contact opening, the top portion of the dielectric wall 116 may be damaged or removed. Afterwards, the void may be exposed and the unwanted conductive material may fill into the void. The unwanted short issue between the gate structure and the S/D structure may occur through the void since the unwanted conductive material is filled in the void. In order to reduce the risk of the short issue, the dielectric wall 116 is reduced or shortened, as shown in FIG. 2P-1. Since the top portion of the dielectric wall 116 is removed during formation of the first S/D recess 127*a* and the second S/D recess 127*b*, the void 113 is also removed when the portion of the dielectric wall 116 is removed. Accordingly, the risk of unwanted short issue between the gate structure and the S/D contact structure through the void is reduced. Therefore, the yield and reliability of the semiconductor structure 100*a* is improved.

In addition, since the height of the shortened dielectric wall 116S is reduced, the S/D contact structure 156 has more contact area in direct contact with the first S/D structure 152*a* and the second S/D structure 152*b*. Therefore, the resistance between the S/D contact structure 156 and the first S/D structure 152*a* is further reduced.

FIG. 2P'-2 shows a cross-sectional view of a semiconductor structure 100*b*, in accordance with some embodiments. The semiconductor structure 100*b* of FIG. 2P'-2 includes elements that are similar to, or the same as, elements of the semiconductor structure 100*a* of FIG. 2P-2, the difference between the FIG. 2P'-2 and FIG. 2P-2 is that, the void 113 is filled with the conductive material which may be the same as the material of the S/D contact structure 156.

Figures 2, 2P, 3, 4:
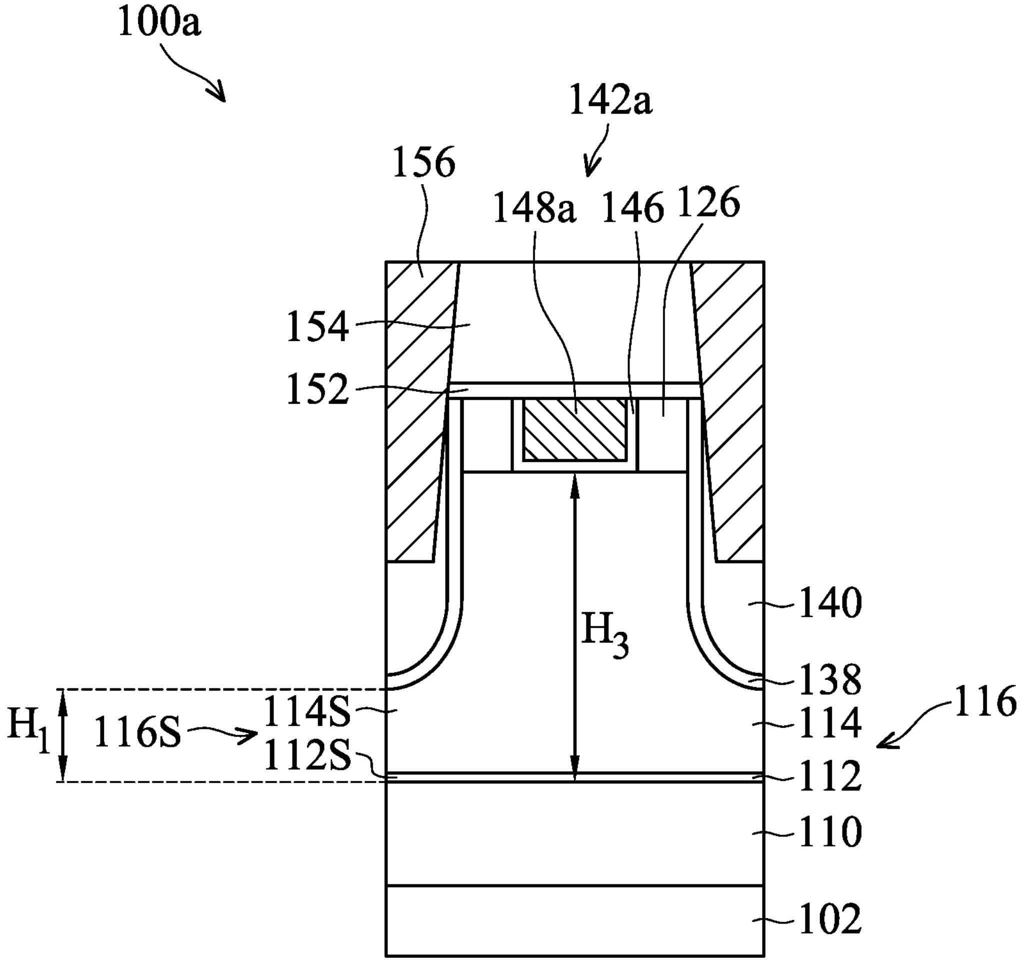
Figure 2P:
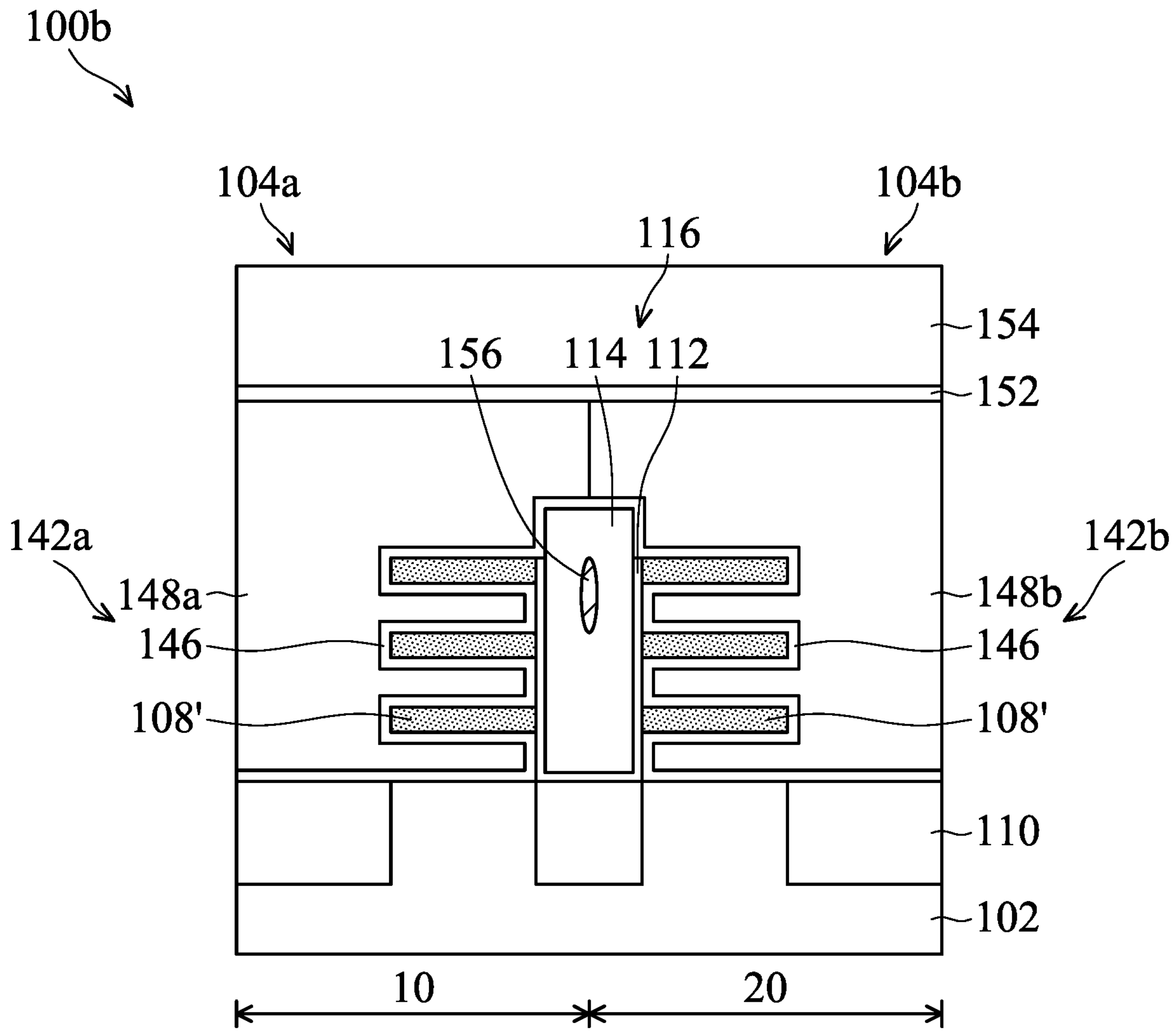
Figure 3:
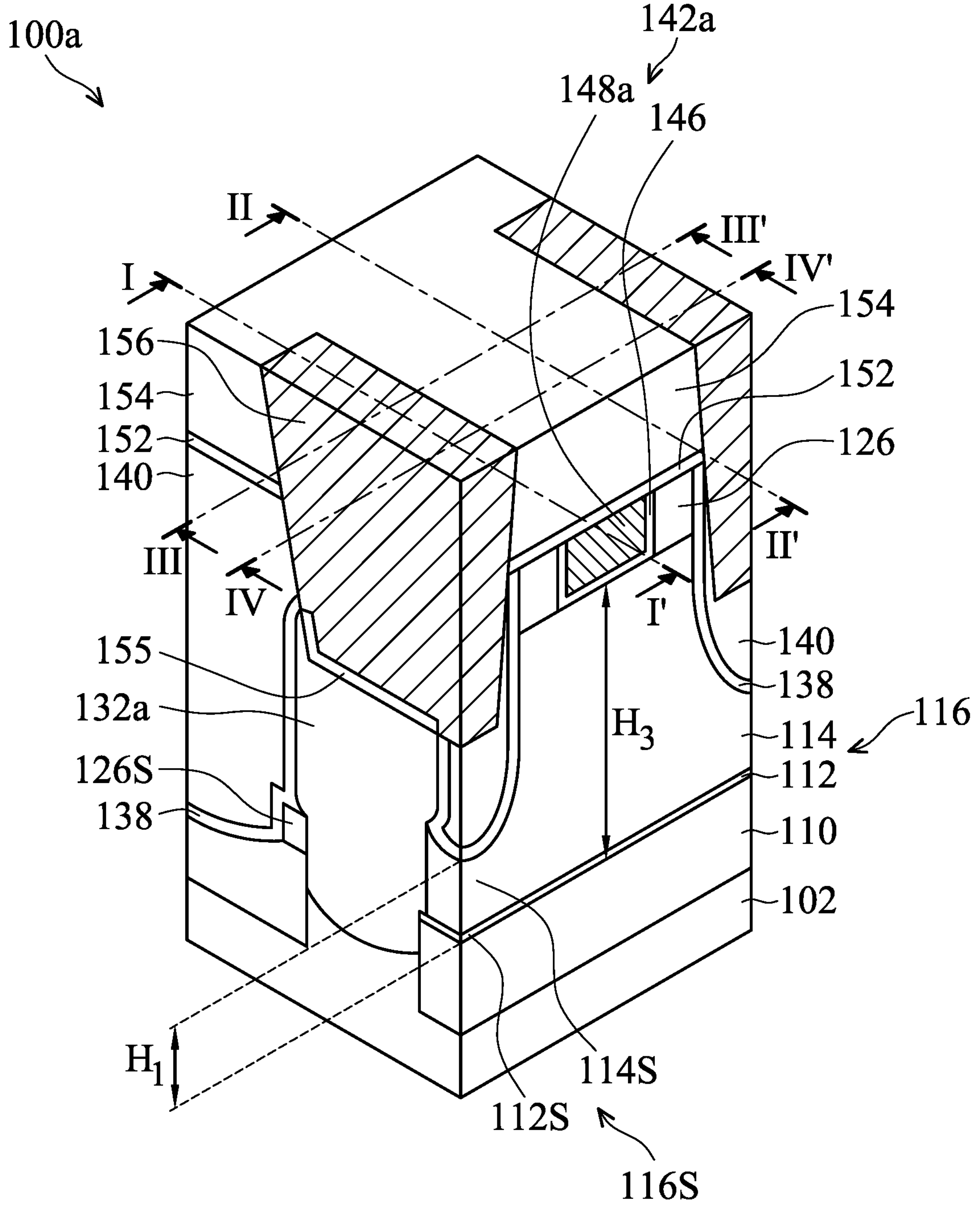
Figure 4:
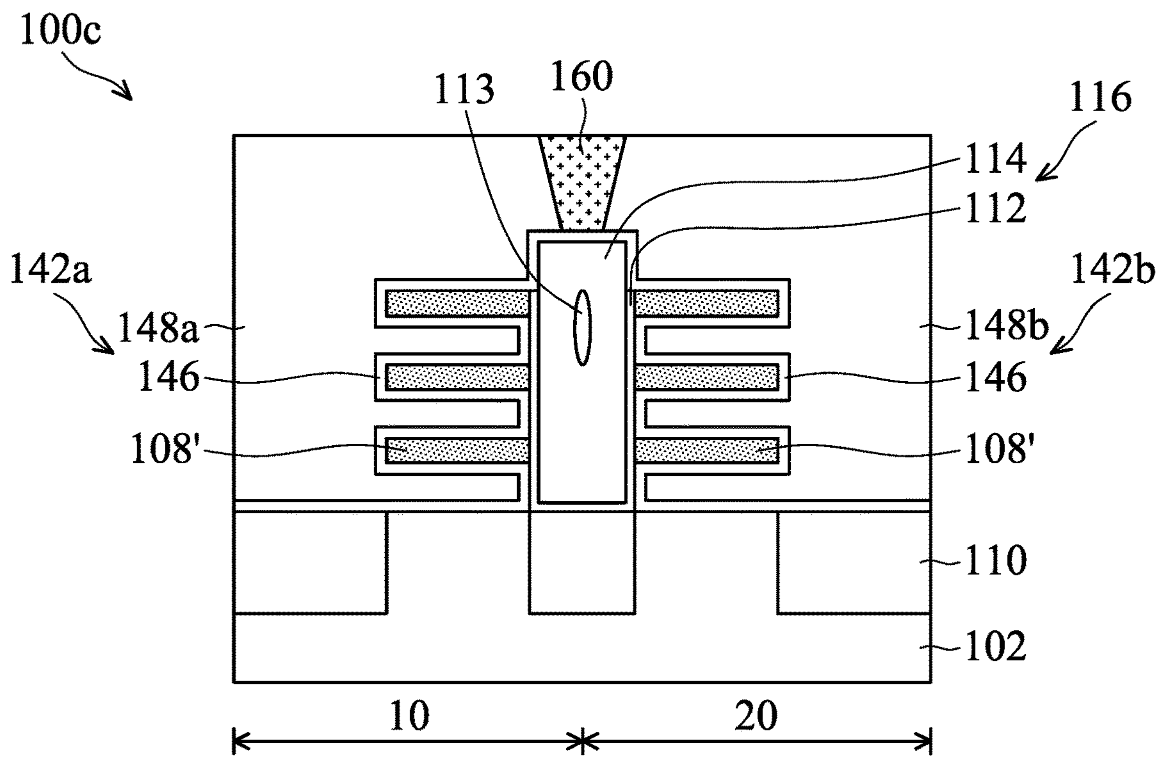

FIG. 4 shows a cross-sectional view of a semiconductor structure 100*c*, in accordance with some embodiments. The semiconductor structure 100*c* of FIG. 4 includes elements that are similar to, or the same as, elements of the semiconductor structure 100*a* of FIG. 2P-2, the difference between the FIG. 4 and FIG. 2P-2 is that, a cap structure 160 is formed over the dielectric wall 116. The cap structure 160 is in direct contact with the gate dielectric layer 146. The cap structure 160 is used to protect the underlying layers from damage during the subsequent etching processes.

In some embodiments, the cap structure 160 is made of oxide, such as $SiO_2$, SiOCN, SiON, or the like. In some embodiments, the cap structure 160 is made of a high k dielectric material, such as $HfO_2$, $ZrO_2$, $HfAlO_x$, $HfSiO_x$, $Al_2O_3$, or the like. In some embodiments, the cap structure 160 is formed by performing ALD, CVD, PVD, other suitable process, or combinations thereof.

Figure 5:
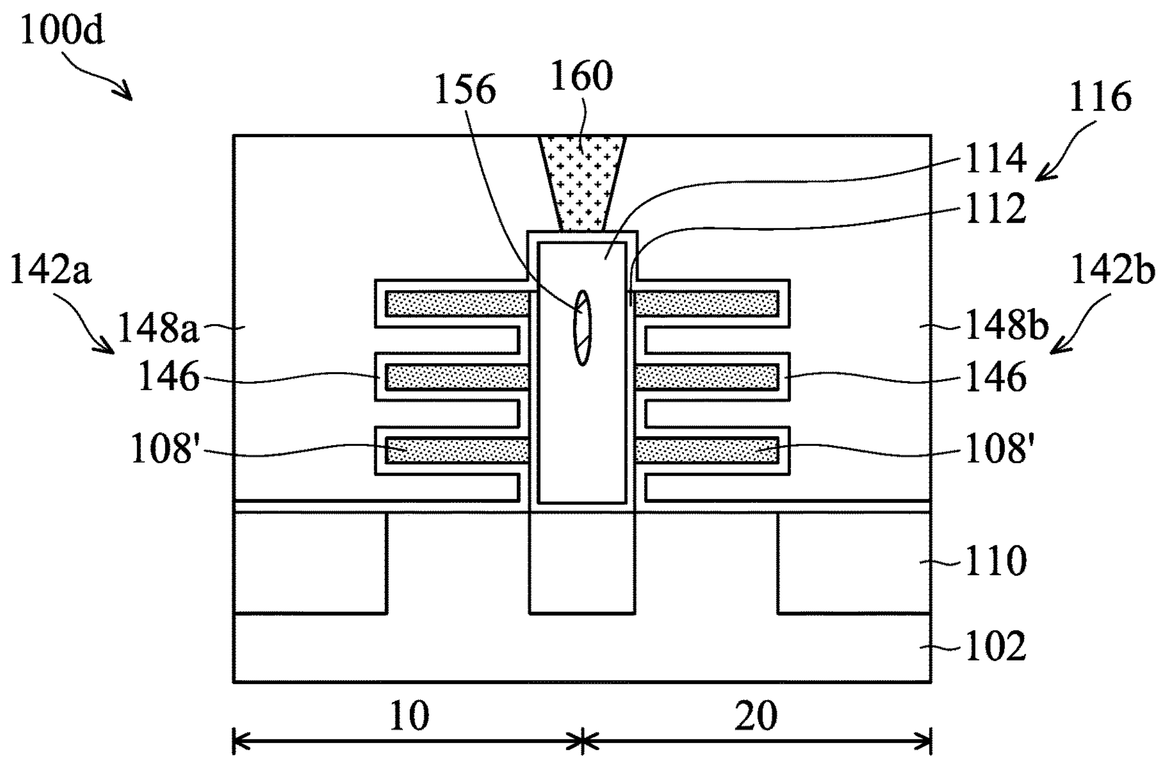
FIG. 5 shows a cross-sectional view of a semiconductor structure, in accordance with some embodiments.

FIG. 5 shows a cross-sectional view of a semiconductor structure 100*d*, in accordance with some embodiments. The semiconductor structure 100*d* of FIG. 5 includes elements that are similar to, or the same as, elements of the semiconductor structure 100*a* of FIG. 2P-2, the difference between the FIG. 2P-2 and FIG. 5 is that, the void 113 is filled with the conductive material which may be the same as the material of the S/D contact structure 156.

Figure 6:
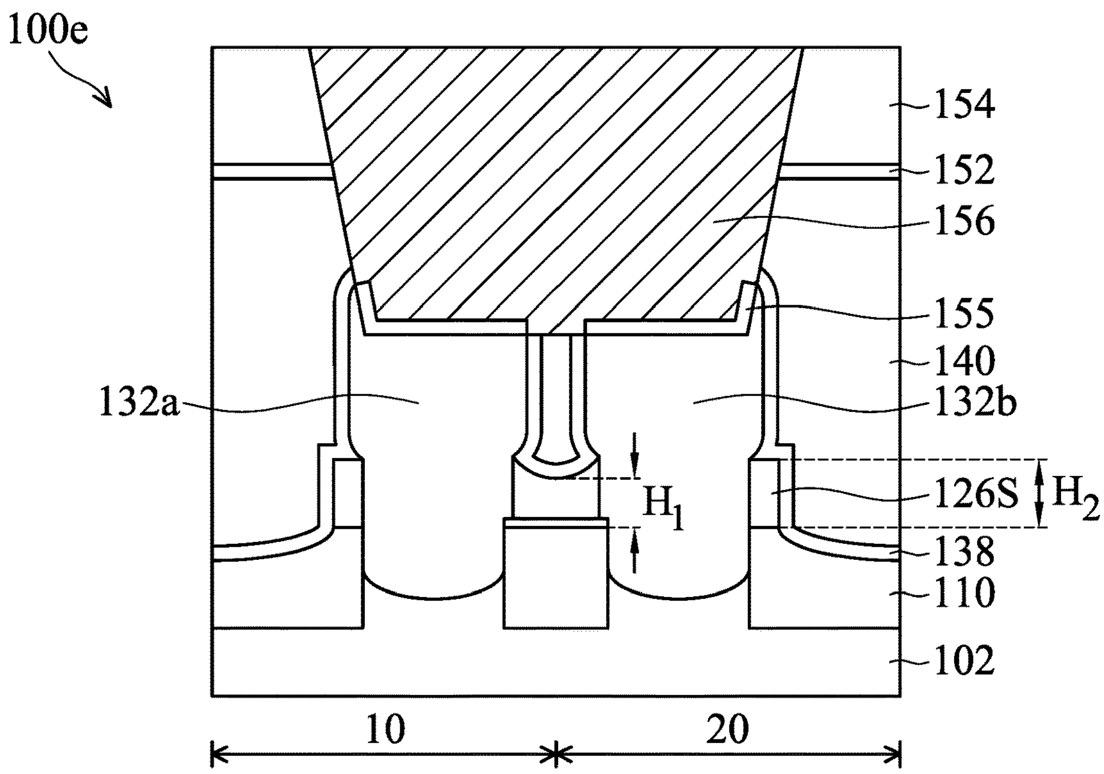
FIG. 6 shows a cross-sectional view of a semiconductor structure, in accordance with some embodiments.

FIG. 6 shows a cross-sectional view of a semiconductor structure 100*e*, in accordance with some embodiments. The semiconductor structure 100*e* of FIG. 6 includes elements that are similar to, or the same as, elements of the semiconductor structure 100*a* of FIG. 2P-2, the difference between the FIG. 6 and FIG. 2P-2 is that, the first height $H_1$ of the shortened dielectric wall 116S is smaller than the second height $H_2$ of the shortened spacer layer 126S. In other words, the second height $H_2$ of the shortened spacer layer 126S is greater than the first height $H_1$ of the shortened dielectric wall 116S.

Figure 7:
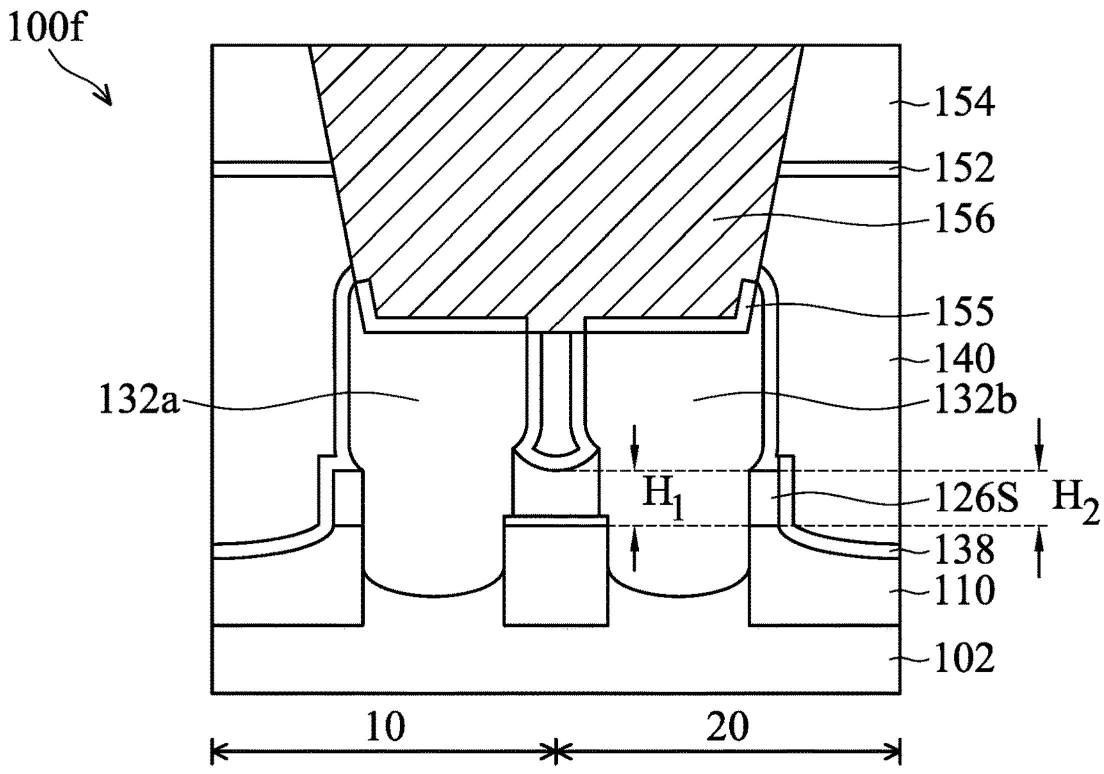
FIG. 7 shows a cross-sectional view of a semiconductor structure, in accordance with some embodiments.

FIG. 7 shows a cross-sectional view of a semiconductor structure 100*f*, in accordance with some embodiments. The semiconductor structure 100*f* of FIG. 7 includes elements that are similar to, or the same as, elements of the semiconductor structure 100*a* of FIG. 2P-2, the difference between the FIG. 7 and FIG. 2P-2 is that, the first height $H_1$ of the shortened dielectric wall 116S is substantially equal to the second height $H_2$ of the shortened spacer layer 126S.

Figure 8:
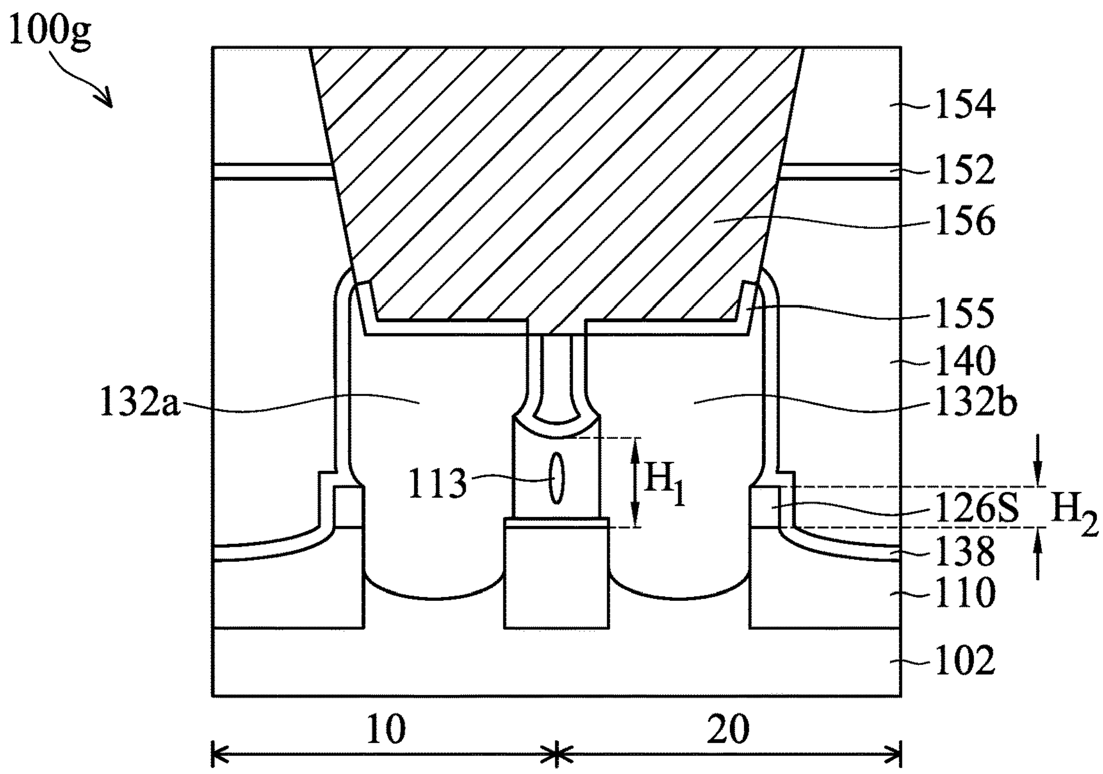
FIG. 8 shows a cross-sectional view of a semiconductor structure, in accordance with some embodiments.

FIG. 8 shows a cross-sectional view of a semiconductor structure 100*g*, in accordance with some embodiments. The semiconductor structure 100*g* of FIG. 8 includes elements that are similar to, or the same as, elements of the semiconductor structure 100*a* of FIG. 2P-2, the difference between the FIG. 8 and FIG. 2P-2 is that, the void 113 is formed in the shortened dielectric wall 116S. Although the void 113 is formed in the shortened dielectric wall 116S, the top surface of the shortened dielectric wall 116S is lower than the bottom surface of the S/D contact structure 156, the conductive material of the S/D contact structure 156 will not penetrate into the void 113. Therefore, the unwanted short issue will not occur.

Figure 9:
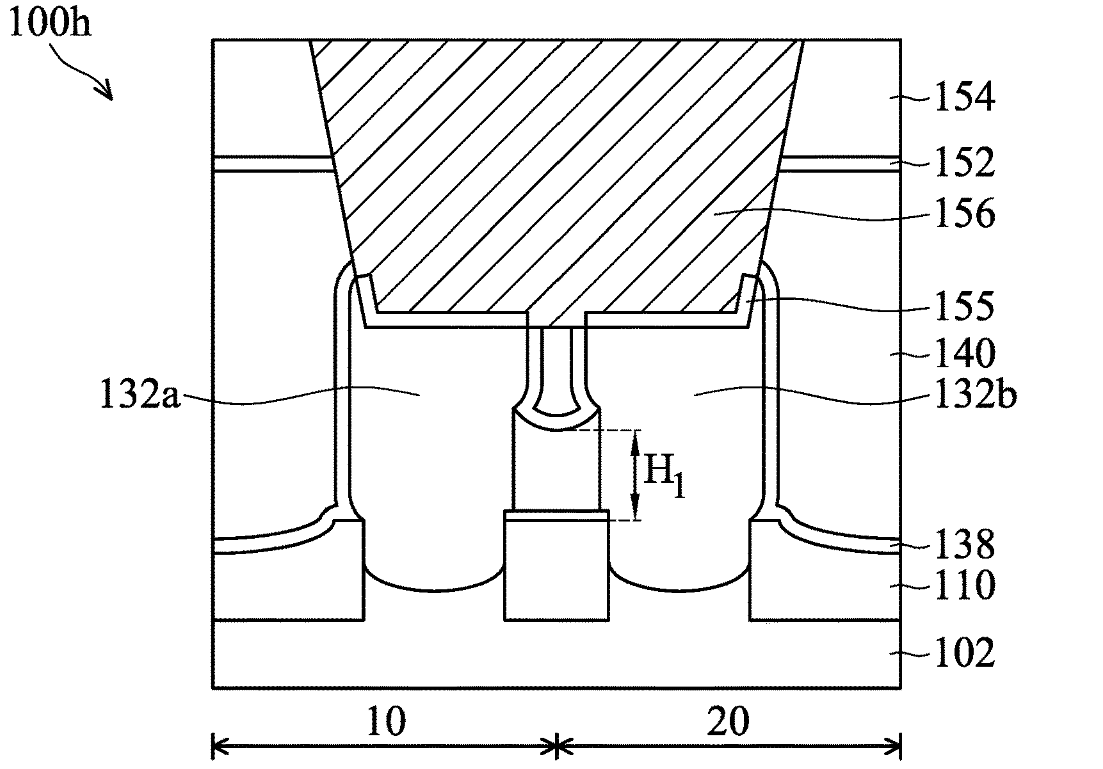
FIG. 9 shows a cross-sectional view of a semiconductor structure, in accordance with some embodiments.

FIG. 9 shows a cross-sectional view of a semiconductor structure 100*h*, in accordance with some embodiments. The semiconductor structure 100*h* of FIG. 9 includes elements that are similar to, or the same as, elements of the semiconductor structure 100*a* of FIG. 2P-2, the difference between the FIG. 9 and FIG. 2P-2 is that, no spacer layer 126 is adjacent to the first S/D structure 132*a* and the second S/D structure 132*b*.

It should be noted that, a portion of the dielectric wall 116 is removed to form the shortened dielectric wall 116S, the first S/D structure 132*a* and the second S/D structure 132*b* extend above the top surface of the shortened dielectric wall 116S. The S/D contact structure 156 is not in direct contact with the shortened dielectric wall 116S. The risk of unwanted short issue between the first gate structure 142*a* and the S/D contact structure 156 through the void is reduced. In addition, the S/D contact structure 156 has more contact area with the first S/D structure 132*a* and the second S/D structure 132*b*. Therefore, the yield, the reliability and the performance of the semiconductor structure are improved.

It should be appreciated that the semiconductor structures 100*a* to 100*h* having the shortened dielectric wall 116S between the first S/D structure 132*a* and the second S/D structure 132*b* described above may also be applied to FinFET structures, although not shown in the figures.

It should be noted that same elements in FIGS. 1A to 9 may be designated by the same numerals and may include similar or the same materials and may be formed by similar or the same processes; therefore such redundant details are omitted in the interest of brevity. In addition, although FIGS. 1A to 9 are described in relation to the method, it will be appreciated that the structures disclosed in FIGS. 1A to 9 are not limited to the method but may stand alone as structures independent of the method. Similarly, although the methods shown in FIGS. 1A to 9 are not limited to the disclosed structures but may stand alone independent of the structures. Furthermore, the nanostructures described above may include nanowires, nanosheets, or other applicable nanostructures in accordance with some embodiments.

Also, while disclosed methods are illustrated and described below as a series of acts or events, it will be appreciated that the illustrated ordering of such acts or events may be altered in some other embodiments. For example, some acts may occur in different orders and/or concurrently with other acts or events apart from those illustrated and/or described above. In addition, not all illustrated acts may be required to implement one or more aspects or embodiments of the description above. Further, one or more of the acts depicted above may be carried out in one or more separate acts and/or phases.

Furthermore, the terms "approximately," "substantially," "substantial" and "about" describe above account for small variations and may be varied in different technologies and be in the deviation range understood by the skilled in the art. For example, when used in conjunction with an event or circumstance, the terms can refer to instances in which the event or circumstance occurs precisely as well as instances in which the event or circumstance occurs to a close approximation.

Embodiments for forming semiconductor structures may be provided. The semiconductor structure includes forming a gate structure, a source/drain (S/D) structure adjacent to the gate structure, and an S/D contact structure over the S/D structure. A dielectric wall is formed below the gate structure and the S/D contact structure. The dielectric wall has a first portion directly below the S/D contact structure and a second portion directly below the gate structure. The first portion of the dielectric wall is shortened. The void formed in the dielectric wall is also removed when the top portion of the first portion of the dielectric wall is removed. Since the dielectric wall is shortened, the S/D contact structure is not in direct contact with the dielectric wall and the void is removed. Accordingly, the risk of unwanted short issue between the gate structure and the S/D contact structure through the void is reduced. In addition, the S/D contact structure has more contact area with the S/D structure. Therefore, the yield, the reliability and the performance of the semiconductor structure are improved.

In some embodiments, a semiconductor structure is provided. The semiconductor structure includes a gate structure formed over a substrate, and a first source/drain (S/D) structure formed adjacent to the gate structure. The semiconductor structure includes an S/D contact structure formed over the first SID structure, and a dielectric wall formed below the gate structure and the SID contact structure. The dielectric wall has a first portion directly below the SID contact structure and a second portion directly below the gate structure, the first portion has a first height along a vertical direction, the second portion has a second height along the vertical direction, and the first height is smaller than the second height.

In some embodiments, a semiconductor structure is provided. The semiconductor structure includes a gate structure formed over a substrate, and a first source/drain (S/D) structure formed adjacent to the gate structure. The semiconductor structure also includes a second S/D structure adjacent to the first S/D structure, and a dielectric wall between the first S/D structure and the second S/D structure. The first S/D structure extends above a top surface of the dielectric wall.

In some embodiments, a method for forming a semiconductor structure is provided. The method includes forming a first stack structure and a second stack structure over a substrate, and forming a dielectric wall between the first stack structure and the second stack structure. The method also includes removing a portion of the first stack structure to form a recess, and removing a portion of the dielectric wall to form a shortened dielectric wall. The method includes forming an S/D structure in the recess, and the S/D structure extends above the shortened dielectric wall. The method includes forming an etching stop layer over the S/D structure, and forming an interlayer dielectric (ILD) layer over the etching stop layer. The method also includes removing a portion of the ILD layer and a portion of the etching stop layer to form a trench. A top surface of the S/D structure is exposed by the trench. The method further includes forming a SID contact structure in the trench, wherein a bottom surface of the S/D contact structure is higher than a top surface of the shortened dielectric wall.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A semiconductor structure, comprising:
- a gate structure formed over a substrate;
- a first source/drain (S/D) structure formed adjacent to the gate structure;
- an S/D contact structure formed over the first S/D structure; and
- a dielectric wall formed below the gate structure and the S/D contact structure, wherein:
  - the dielectric wall has a first portion directly below the S/D contact structure and a second portion directly below the gate structure,
  - a bottommost surface of the first S/D structure is below a bottommost surface of the dielectric wall,
  - the first portion has a first height along a vertical direction,
  - the second portion has a second height along the vertical direction, and
  - the first height is smaller than the second height.

2. The semiconductor structure as claimed in claim 1, further comprising:
- a spacer layer adjacent to the first S/D structure, wherein the spacer layer has a third height along the vertical direction, and the third height is smaller than the first height.

3. The semiconductor structure as claimed in claim 1, further comprising:
- a first stack structure formed over the substrate, wherein the first stack structure comprises a plurality of nanostructures; and
- a second stack structure formed adjacent to the first stack structure, wherein the second stack structure comprises a second plurality of nanostructures, and the dielectric wall is between the first stack structure and the second stack structure.

4. The semiconductor structure as claimed in claim 1, wherein a portion of the first S/D structure is in direct contact with the dielectric wall.

5. The semiconductor structure as claimed in claim 1, further comprising:
- a second S/D structure formed over the substrate, wherein the dielectric wall is between the first S/D structure and the second S/D structure.

6. The semiconductor structure as claimed in claim 1, further comprising:

an etching stop layer formed over the first S/D structure, wherein a portion of the etching stop layer is in direct contact with the first portion of the dielectric wall.

7. The semiconductor structure as claimed in claim 6, further comprising:

an interlayer dielectric (ILD) layer formed over the etching stop layer, wherein a portion of the ILD layer is directly below the S/D contact structure and surrounded by the etching stop layer.

8. The semiconductor structure as claimed in claim 1, further comprising:

an inner spacer layer formed between the gate structure and the first S/D structure.

9. The semiconductor structure as claimed in claim 1, wherein there is a void in the dielectric wall.

10. A semiconductor structure, comprising:

a gate structure formed over a substrate;

a first source/drain (S/D) structure formed adjacent to the gate structure;

a second S/D structure adjacent to the first S/D structure; and a dielectric wall between the first S/D structure and the second S/D structure, wherein:

a bottommost surface of the first S/D structure is below a bottommost surface of the dielectric wall, the first S/D structure extends above a top surface of the dielectric wall, and the top surface of the dielectric wall is concave.

11. The semiconductor structure as claimed in claim 10, further comprising:

a spacer layer formed adjacent to the first S/D structure, wherein a height of the dielectric wall is greater than a height of the spacer layer.

12. The semiconductor structure as claimed in claim 10, further comprising:

a first stack structure and a second stack structure formed over the substrate, wherein the dielectric wall is between and in direct contact with the first stack structure and the second stack structure.

13. The semiconductor structure as claimed in claim 12, wherein the dielectric wall comprises a core dielectric layer and a liner dielectric layer below the core dielectric layer, and the liner dielectric layer is in direct contact with the first stack structure and the second stack structure.

14. The semiconductor structure as claimed in claim 13, wherein the gate structure comprises a gate dielectric layer, and the gate dielectric layer is in direct contact with the liner dielectric layer of the dielectric wall.

15. The semiconductor structure as claimed in claim 10, further comprising:

an S/D contact structure formed over the first S/D structure, wherein a bottom surface of the S/D contact structure is higher than the top surface of the dielectric wall.

16. The semiconductor structure as claimed in claim 10, further comprising:

an etching stop layer formed over the first S/D structure, wherein a portion of the etching stop layer is in direct contact with the dielectric wall.

17. A semiconductor structure, comprising:

a first source/drain (S/D) structure;

a second S/D structure;

a dielectric wall between a first portion of a sidewall of the first S/D structure and a first portion of a sidewall of the second S/D structure, wherein:

a bottommost surface of the first S/D structure is below a bottommost surface of the dielectric wall, the dielectric wall comprises a liner dielectric layer and a core dielectric layer, and a bottommost surface of the core dielectric layer is above a topmost surface of the liner dielectric layer; and an etch stop layer between a second portion of the sidewall of the first S/D structure and a second portion of the sidewall of the second S/D structure.

18. The semiconductor structure as claimed in claim 17, wherein the etch stop layer contacts a top surface of the dielectric wall.

19. The semiconductor structure as claimed in claim 17, further comprising:

an interlayer dielectric disposed between the second portion of the sidewall of the first S/D structure and the second portion of the sidewall of the second S/D structure and separated from the second portion of the sidewall of the first S/D structure and the second portion of the sidewall of the second S/D structure by the etch stop layer.

20. The semiconductor structure as claimed in claim 17, further comprising:

a spacer, wherein the first S/D structure is between the spacer and the dielectric wall.

* * * * *